(12) United States Patent
Wu

(10) Patent No.: US 11,408,591 B2
(45) Date of Patent: Aug. 9, 2022

(54) LED LIGHTING MODULE WITH MICRO LED ARRAYS AND PHOSPHOR FILM

(71) Applicant: UNITY OPTO TECHNOLOGY CO., LTD., New Taipei (TW)

(72) Inventor: Ching-Huei Wu, New Taipei (TW)

(73) Assignee: UNITY OPTO TECHNOLOGY CO., LTD., New Taipei (TW)

( * ) Notice: Subject to any disclaimer, the term of this patent is extended or adjusted under 35 U.S.C. 154(b) by 364 days.

(21) Appl. No.: 16/777,909

(22) Filed: Jan. 31, 2020

(65) Prior Publication Data

US 2020/0166196 A1 May 28, 2020

Related U.S. Application Data

(62) Division of application No. 16/165,354, filed on Oct. 19, 2018, now Pat. No. 11,162,662.

(30) Foreign Application Priority Data

Aug. 31, 2018 (TW) .................................. 107130695

(51) Int. Cl.
*F21V 9/30* (2018.01)
*F21Y 113/13* (2016.01)
*F21Y 105/10* (2016.01)
*F21Y 115/10* (2016.01)

(52) U.S. Cl.
CPC ............. *F21V 9/30* (2018.02); *F21Y 2105/10* (2016.08); *F21Y 2113/13* (2016.08); *F21Y 2115/10* (2016.08)

(58) Field of Classification Search
CPC ................................ F21V 9/30; F21Y 2113/13
See application file for complete search history.

(56) References Cited

U.S. PATENT DOCUMENTS

| | | | |
|---|---|---|---|
| 2004/0046184 A1‡ | 3/2004 | Yanagawa | H01L 51/5253 257/200 |
| 2010/0073914 A1‡ | 3/2010 | Park | G02F 1/133608 362/97.2 |
| 2013/0093706 A1‡ | 4/2013 | Kurasawa | G06F 3/0443 345/173 |
| 2013/0120967 A1‡ | 5/2013 | Liao | H01L 33/486 362/97.1 |
| 2014/0124802 A1‡ | 5/2014 | Do | H01L 33/50 257/89 |
| 2015/0048390 A1‡ | 2/2015 | Imazu | H01L 33/60 257/88 |
| 2017/0125650 A1‡ | 5/2017 | Pickett | C09K 11/02 |

(Continued)

*Primary Examiner* — Joseph L Williams
(74) *Attorney, Agent, or Firm* — Fei-hung Yang

(57) ABSTRACT

An LED lighting module with micro led arrays and phosphor film is disclosed. The LED lighting module includes a plurality of micro LED arrays and a phosphor film. The micro LED arrays are respectively composed of at least one micro LED. The phosphor film is disposed on one side of the micro LED arrays; and the phosphor film has a transparent substrate and is provided with a plurality of light emitting regions. The plurality of light emitting regions are arranged adjacent to each other and into a matrix form, and are set corresponding to the micro LED arrays collimation respectively. A part or the whole of the surface of the plurality of light emitting regions is provided with at least one type of phosphor powder.

57 Claims, 17 Drawing Sheets

(56) References Cited

U.S. PATENT DOCUMENTS

2017/0309798 A1‡ 10/2017 Bonar .................... H01L 33/22
2018/0190712 A1‡ 7/2018 Xu ...................... H01L 33/0012
2018/0341151 A1‡ 11/2018 Kurita ...................... F21V 9/30

‡ imported from a related application

LED LIGHTING MODULE WITH MICRO LED ARRAYS AND PHOSPHOR FILM

CROSS-REFERENCE TO RELATED APPLICATIONS

This application is a divisional patent application of U.S. Pat. No. 11,162,662 filed on Oct. 19, 2018, the entire contents of which are hereby incorporated by reference for which priority is claimed under 35 U.S.C. § 120.

FIELD OF INVENTION

The present invention relates to the field of LED lighting modules, in particular to the LED lighting module with a micro LED and a phosphor film covering the whole surface of each light emitting region to achieve the effect of outputting different light colors and overcoming the inconvenience of the conventional micro LED capable of outputting a fixed light color only, so as to effectively improve the display performance of the LED lighting module and a display manufactured by applying the LED lighting module.

BACKGROUND OF INVENTION

1. Description of the Related Art

In the area of the present illumination and display, LED is a popular light source. Since the demand for a design of compact and thin products become increasingly higher, new-generation micro LED products are introduced to the market. When the micro LED is applied in the display technology, the micro LED backlight source is designed with the thin film, miniaturization, and array features, so that the micro LED unit can be smaller than 100 microns, so that each pixel has the individually addressing and driving effect to emit light just like the OLED. At present, mass transfer is a main research subject for key micro LED technologies to be broken through. In practices, many manufacturers design and develop different ways for the breakthrough. Although the micro LED has the special individual addressing and driving effect for light emission, the conventional LED light color technology is still limited by the self-generated blue, violet, or ultraviolet light with a fixed wavelength and a low efficiency. In other words, the so-called white light LED or other colors in the past still requires the packaging of other types of phosphor powders to absorb the aforementioned light source in order to excite or mix the light source to provide different light color expressions. The conventional way of packaging the phosphor powder is nothing more than mixing with a gel and then covering it on a light emitting chip, and the technology is developed from surface mount technology (SMT) to flip chip, and further to chip size package (CSP). However, these packaging methods cannot be applied directly to new micro LEDs and there is a conflict in technical integration. Particularly, if the micro LED is used as a direct backlight source and even if the threshold of mass transfer can be broken through, the original light color of a diode without too many choices still requires a better configuration, structure or method for the micro LED after the mass transfer, so that the micro LEDs can achieve the final objectives of providing independent addressing and producing different light colors.

In view of the aforementioned requirements, the present invention provides an LED lighting module which uses the micro LED as a light emitting source and operates together with a new design of phosphor film technology, so that a light source regardless of using the micro LEDs with a light color of a single wavelength or two or more light colors of different wavelengths which is used as a light emitting source may have one or more phosphor films, and the phosphor films may be stacked or sandwiched to provide an independent addressing control of the micro LEDs, and emit different light colors or even achieve a double-sided display effect.

2. Summary of the Invention

Therefore, it is a primary objective of the present invention to provide an LED lighting module and a display manufactured by applying the LED lighting module, wherein a phosphor film covering the whole surface of the LED lighting module and having different divided light emitting regions, so that each micro LED can produce different light colors. When the LED lighting module is applied to a display, the light output method of this invention is different from the traditional way of using a white light and a color filter. The present invention can output light directly to reduce the loss of light quality and improve the picture quality after the individual addressing control of each micro LED, so as to achieve a thin LED lighting module and improve the convenience of installation.

To achieve the aforementioned and other objectives, the present invention provides an LED lighting module, comprising: a carrier board; a plurality of micro LED arrays, installed onto the carrier board, and formed by at least one micro LED; and at least one phosphor film, disposed on a side of the micro LED arrays, wherein the phosphor film has a transparent substrate which is a one-piece structure, and the transparent substrate has a plurality of light emitting regions defined thereon, and the light emitting regions are arranged adjacent to one another and into a matrix form and configured to be corresponsive to the collimation of the micro LED arrays, and at least one phosphor powder being is disposed on a part or the whole of a surface of the light emitting regions, and has the single light emitting region of the phosphor powder, and the phosphor powder has a substantially uniform thickness, such that the light emitting regions provide different light color expressions. Therefore, the LED lighting module uses a phosphor film covering the whole surface of each light emitting region and one or more micro LEDs of different wavelengths to provide the effect of showing various different output light colors from the micro LED arrays respectively and an individual addressing control to improve the light color display control efficiency effectively and reduce the overall thickness of the LED lighting module significantly.

The present invention further provides a display, comprising: at least one display panel, having a plurality of pixel units; and an LED lighting module, installed on a side of the display panel, comprising: a carrier board; a plurality of micro LED arrays, installed onto the carrier board, and formed by at least one micro LED; and at least one phosphor film, disposed on a side of the micro LED arrays, wherein the phosphor film has a transparent substrate which is a one-piece structure, and the transparent substrate has a plurality of light emitting regions defined thereon, and the light emitting regions are arranged adjacent to one another and into a matrix form and configured to be corresponsive to the collimation of the micro LED arrays, and at least one phosphor powder being is disposed on a part or the whole of a surface of the light emitting regions, and has the single light emitting region of the phosphor powder, and the phosphor powder has a substantially uniform thickness, such that the light emitting regions provide different light color expressions, and each of the pixel units is configured to be corresponsive to the positions of at least three adjacent light emitting regions. Therefore, the LED lighting module allows the light output of each pixel unit of the display panel to have an individual addressing control directly through the micro LED arrays and at least three light emitting regions to achieve a precise pixel display control, and improve the picture quality, response speed, brightness, etc. of the display.

According to the aforementioned two embodiments, the micro LED arrays of the LED lighting module may have different implementation modes. For example, the phosphor film is provided for changing the output light color according to different implementation modes of the micro LED array. In an embodiment, the micro LED arrays emit lights of the same light color, and each of the micro LED arrays is formed by two or more micro LEDs of the same light emitting wavelength, wherein each micro LED array has the same light color, and each of the micro LED arrays is formed by the plurality of micro LEDs of the same light emitting wavelength to enhance the light output intensity of each micro LED array. In another embodiment, the micro LED arrays emit lights of the same light color, and each of the micro LED arrays is formed by two or more micro LEDs of different light emitting wavelengths, wherein each micro LED array has the same light color, and the output light color of each micro LED array is formed by mixing two or more different light emitting wavelengths of the micro LEDs, so that the LED lighting module may have the control and adjustment for various light colors to comply with the required light output performance. In another embodiment, the micro LED arrays emit lights of different light colors, so that each of the micro LED arrays emits lights of different light colors, and then the light emitting regions of the phosphor film are adjusted to produce the required light color.

According to the aforementioned implementation mode of each embodiment, the phosphor powder of a further embodiment is formed on the light emitting regions of the transparent substrate by a spraying, printing, evaporation, or sputtering method, so that the phosphor powder can be set onto the light emitting regions quickly as needed.

In an embodiment, when each of the micro LED arrays comprising at least two coupled micro LEDs, and the at least two coupled micro LEDs are formed on the same substrate. Therefore, the micro LED can be installed in a very small micro LED array, and the micro LEDs are installed with an interval apart from one another, so that the style of each light emitting element is more consistent.

To improve the transparency of the LED lighting module in order to achieve the effect of a full cycle light output, the transparent substrate and the carrier board of an embodiment are made of a transparent material.

According to the description of the aforementioned embodiment, another embodiment further has the phosphor film on the other side, so that the LED lighting module has a double-sided light output effect.

In the display in accordance with an embodiment of the present invention, when both sides of the micro LED arrays have the phosphor film, both sides of the LED lighting module may have the display panel to provide a double-sided display effect.

Based on the double-sided display structure, this invention further discloses an embodiment of the display further comprising a frame provided for installing the display panel and the LED lighting module, at least one receiving groove formed on an inner side of the frame and disposed between the display panel and the LED lighting module for accommodating a power supply module and a processing module which are electrically coupled to the LED lighting module. The power supply module and the processing module are accommodated by the lateral side of the display to effectively hind and prevent electronic components from being exposed to the outside.

Further, another embodiment discloses the display panels which are touch panels telecommunicatively coupled to the processing module, so that the display has a double-sided display effect and a double-sided touch effect.

In addition to the aforementioned structure, the display in accordance with an embodiment of the present invention further comprises a frame for installing the display panel and the LED lighting module, and the frame has at least one port electrically coupled to the LED lighting module and provided for telecommunicatively coupling an electronic device. The display can be connected to other external electronic devices to facilitate users' operation and control.

In a preferred embodiment, the phosphor powder of the LED lighting module is a quantum dot or a powder particle of the phosphor powder, wherein there are at least 20 particles in the single light emitting region, so that the light of the micro LED arrays together with the phosphor film can provide a better light color expression. The transparent substrate is made of a material selected from PET, PMMA, PC or glass to provide high transparency and protection effect.

In an embodiment, when the phosphor film comes with a quantity of two or more, the phosphor films are vertically stacked on a same side and configured to be corresponsive to the collimated positions of the micro LED arrays, and the positions of the phosphor powders of the phosphor films are vertically staggered. The LED lighting module may adjust the color performance of each of the light of the micro LED arrays by a plurality of entire-surface type phosphor films, so that the light color will be more accurate.

Similarly, when the phosphor film comes with a quantity of two or more, there may be various implementation modes of the micro LED arrays. For example, the micro LED arrays emit lights of the same light color, and each of the micro LED arrays is formed by two or more micro LEDs of the same light emitting wavelength; or the micro LED arrays emit lights of the same light color, and each of the micro LED arrays is formed by two or more micro LEDs of different light emitting wavelengths; or the micro LED arrays emit lights of different light colors, so that the LED lighting module can change the light emitting wavelength of the micro LEDs according to the required light color expression.

Further, the phosphor powder is formed on the light emitting regions of the transparent substrate by a spraying, printing, evaporation, or sputtering method, so that the phosphor powder can be set on the light emitting regions quickly.

In addition, when each of the micro LED arrays comprising at least two coupled micro LEDs, and the at least two coupled micro LEDs are formed on the same substrate. Therefore, the micro LEDs can be installed in a very small micro LED array, and the micro LEDs are installed with an interval apart with one another, so that each light emitting element has a more consistent style.

Preferably, the phosphor powder is a quantum dot or a powder particle of the phosphor powder, and there are at least 20 particles in the single light emitting region to provide a better excitation effect, and the transparent substrate is made of PET, PMMA, PC or glass to provide high transparency and protection effect.

To eliminate mixed light problem caused by the light spillage of the micro LED arrays to other regions and provide a more accurate light color for each of the light emitting regions of the phosphor film, specific implementation mode may be adopted. For example, the phosphor film has a plurality of barriers formed on a lower surface of the phosphor film and configured to be corresponsive to the micro LED arrays respectively, and the barriers are situated between the light emitting regions to prevent the light emitted from the micro LED arrays from spilling to the non-collimated position of the light emitting region; or has a plurality of barriers formed on an upper surface of the phosphor film and configured to be corresponsive to the micro LED arrays respectively, and the barriers are situated between the light emitting regions to prevent the light emitted from the micro LED arrays from spilling to the non-collimated position of the position of the light emitting region; or the phosphor film has a plurality of barriers formed on an upper surface and a lower surface of the phosphor film and configured to be corresponsive to the micro LED arrays respectively, and the barriers are situated between the light emitting regions to prevent the light emitted from the micro LED arrays from spilling to the non-collimated position of the light emitting region.

In an embodiment, the barriers according to each foregoing implementation mode are formed on the phosphor film by a spraying, printing, evaporation, or sputtering method, so that the barriers can be formed quickly and accurately.

In a further embodiment, the phosphor film has a plurality of grooves, and a photoresist material is filled into the grooves to form the barriers, so that the barriers are extended into the phosphor film to prevent the spillage of light more effectively.

A display in accordance with an embodiment of the present invention comprises at least one fastener disposed at an edge of the carrier board for fixing the relative positions of the carrier board and the phosphor film, so that the light emitting regions corresponding to the micro LED arrays are maintained at a collimation configuration. With the fastener, the assembling positions of the phosphor film and the micro LED arrays can be maintained to enhance the effect of maintaining the lights of the micro LED arrays to be collimated and projected to the fluorescent regions respectively.

In summation of the description above, the present invention discloses the LED lighting module and the display applying the LED lighting module, wherein a special design of one or more phosphor films stacked on the micro LED arrays regardless of using the light color of a single wavelength or two or more different as a light emitting source to provide different light output performances, so that the application of the micro LED is no longer fixed, inefficient, or lack of choices for the output light color. A simple and easy structure and method of installing phosphor powder allows the micro LED to have the individual addressing and driving effect, so as to provide the effect of showing different light colors. Unlike the conventional micro LED related technology, the key point of the present invention is to use a novel phosphor film technology to provide a better way of installing the phosphor powder to the micro LED. This invention can improve the application performance of micro LED significantly and reduce the production cost and inconvenience effectively while complying with the requirements of thin components.

DESCRIPTION OF THE PREFERRED EMBODIMENTS

Figure 1:
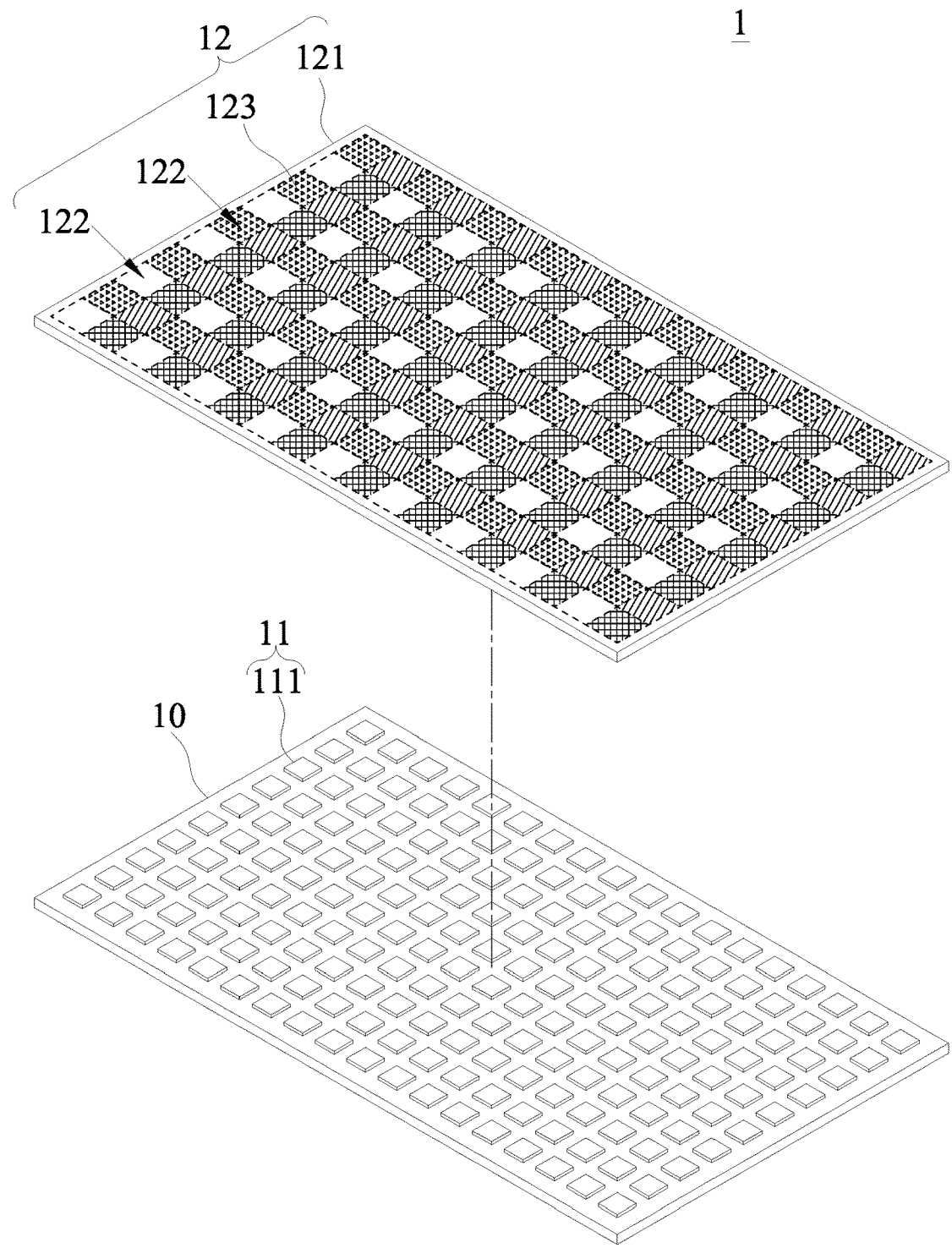
FIG. 1 is a first exploded view of a phosphor film, a micro LED array, and a carrier board in accordance with an embodiment of the present invention.
Figure 2:
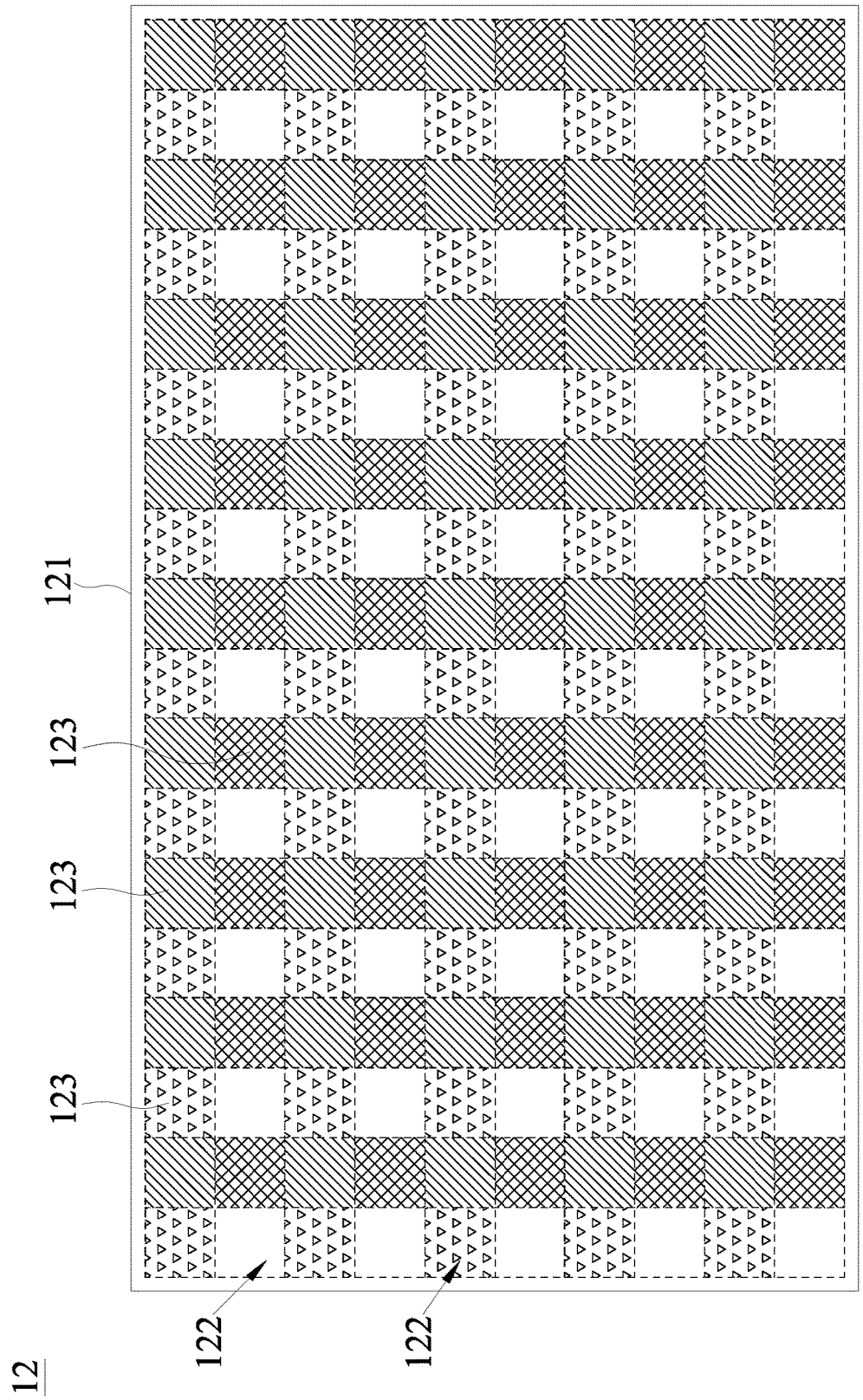
FIG. 2 is a schematic view of a phosphor film in accordance with an embodiment of the present invention.

To make it easier for our examiner to understand the objective, technical characteristics, structure, innovative features, and performance of the invention, we use preferred embodiments together with the attached drawings for the detailed description of the invention. It is noteworthy that the embodiments are provided for the purpose of illustrating the invention but not intended for limiting the scope of the invention such as the size, proportion, installation gap, etc.

With reference to FIGS. 1 to 7 for an LED lighting module 1 in accordance with an embodiment of the present invention, the LED lighting module 1 comprises a carrier board 10, a plurality of micro LED arrays 11, and at least one phosphor film 12.

The micro LED arrays 11 are installed onto the carrier board 10, and the micro LED arrays 11 are formed by at least one micro LED 111. The phosphor film 12 is disposed on a side of the micro LED arrays 11, wherein the phosphor film 12 has a transparent substrate 121 which is a one-piece structure, and the transparent substrate 121 has a plurality of light emitting regions 122 defined thereon, and the light emitting regions 122 are arranged adjacent to one another and into a matrix arrangement, and configured to be corresponsive to the collimated position of the micro LED arrays 11, and at least one phosphor powder 123 is deposited on a part or the whole of a surface of the light emitting regions 122 and the single light emitting region 122 having the phosphor powder 123 and the phosphor powder 123 have a substantial consistent thickness, so that the light emitting regions 122 have different light color expressions. Therefore, the light emitted from each of the micro LED arrays 11 by the novel phosphor film 12 of the present invention shows a different light color by using each of the light emitting regions 122 to simplify the setup of the LED lighting module 1 effectively. Regardless of the light emitting wavelength of the micro LEDs 11, the phosphor film 12 can be adjusted to show a light color, so as to achieve the individual addressing control effect of the micro LED arrays 11 to produce a different light color. It is noteworthy that unlike the conventional micro LED technology, the key point of the present invention is to use a special design of the phosphor film 12 together with the light emitting regions 122 and the micro LED arrays 11 to effectively show different output light colors of the micro LED arrays 11. The technical improvement of the manufacturing process of the micro LED and the mass transfer technology of the micro LED are completely different from the prior art.

In fact, the formation of the conventional white light LED requires the phosphor powder as an exciting material. In the conventional white light LED structure, the phosphor powder is expressed in a doping form. For example, the powder is expressed in drawings or whole-surface drawings, but these drawings are not the solid phosphor film structure provided by the present invention. Particularly, the phosphor film 12 of the present invention further has the light emitting regions 122, so that the single phosphor film 12 can simultaneously have various different light color expressions for the light output.

According to the light output requirement, all of the light emitting regions 122 of the phosphor film 12 have the phosphor powder 123, or some of the light emitting regions 122 have the phosphor powder 123, and the remaining light emitting regions 122 are maintained in a transparent form. In addition, the single light emitting regions 122 having the phosphor powder 123 have a substantially uniform thickness, so that the light excited and emitted from the light emitting region 122 is more even, and the phosphor powders 123 are deposited on an upper surface or a lower surface of the transparent substrate 121. Wherein, the phosphor powder 123 may be more uniform and configured to be corresponsive to a surface of the light emitting regions 122 as needed, and the phosphor powder 123 is formed on the light emitting regions 122 of the transparent substrate 121 by a spraying, printing, evaporation, or sputtering method. In addition, the phosphor film 12 can be attached to the micro LED arrays 11 directly, or installed with an interval apart from the micro LED arrays 11. In this embodiment, each of the micro LED arrays 11 is formed by one of the micro LEDs 111 and preferably the micro LED arrays 11 emit the same light. For example, the micro LED 11 of each of the micro LED arrays 11 emits a blue light. In FIG. 1, when each of the micro LED arrays 11 outputs light from each of the light emitting regions 122 of the phosphor film 12, the light emitting region 122 without the phosphor powder 123 can produce a light color of the light emitted from the micro LED array 11, and the other remaining micro LED arrays 11 can provide different light color expression for the phosphor powder 12 in other different light emitting regions.

Figure 3:
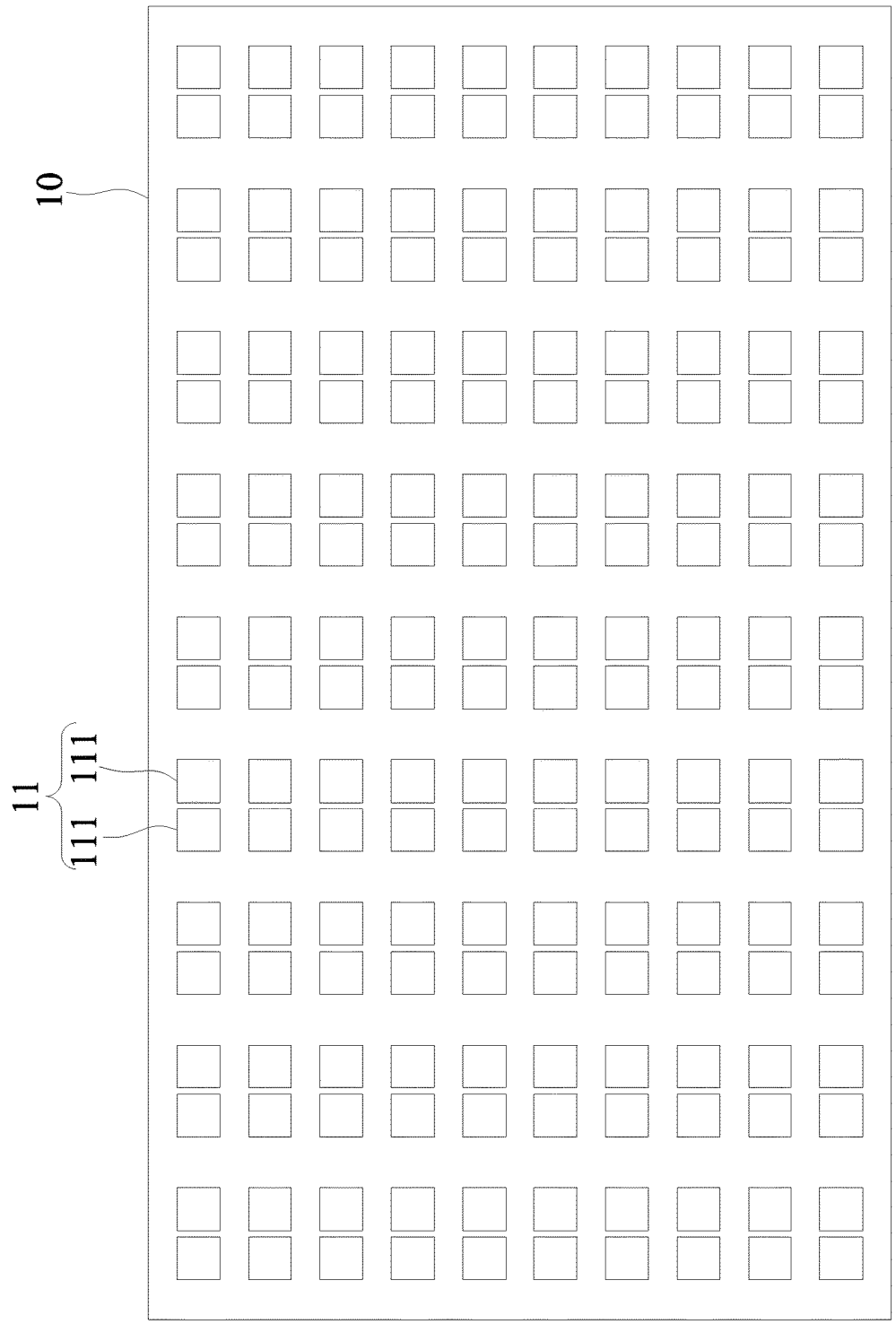
FIG. 3 is a first schematic view of a carrier board and a micro LED array disposed on the carrier board in accordance with an embodiment of the present invention.
Figure 4:
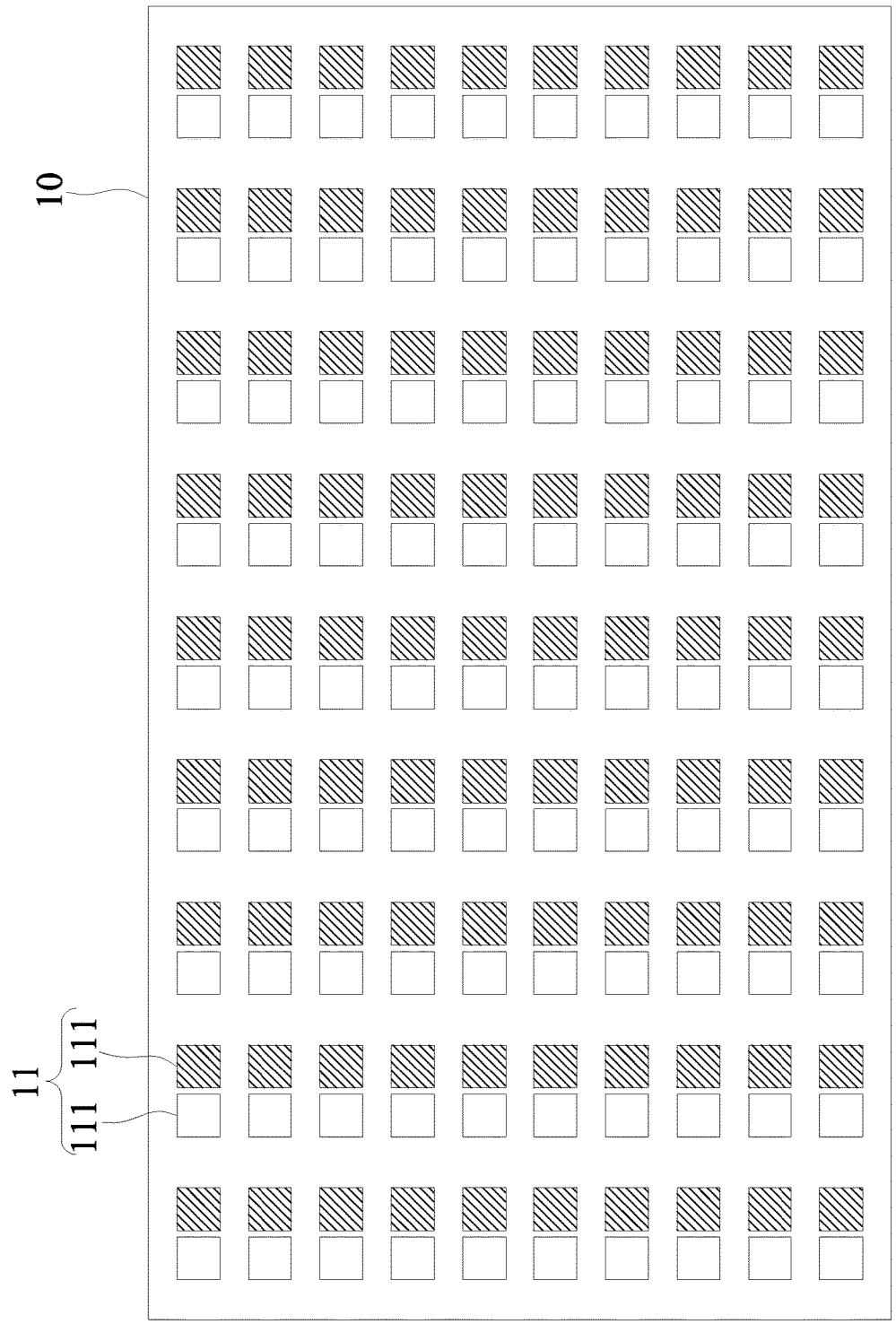
FIG. 4 is a second schematic view of a carrier board and a micro LED array disposed on the carrier board in accordance with an embodiment of the present invention.

When the micro LED arrays 11 emit lights of the same light color, each of the micro LED arrays 11 is formed by one of the micro LEDs 111 or each of the micro LED arrays 11 is formed by two or more micro LEDs 111 of the same light emitting wavelength as shown in FIG. 3. In this embodiment, each of the micro LED arrays 11 has two micro LEDs 111 that emit a blue light with a fixed wavelength, and each of the light emitting regions 122 and two micro LEDs 111 form the collimation of the micro LED array 11, or each of the micro LED arrays 11 is formed by two or more micro LEDs 111 of different light emitting wavelengths as shown in FIG. 4, and each of the micro LED arrays 11 emits a light of the same light color, and each of the micro LED arrays 11 is formed by two micro LEDs 111 of different light emitting wavelengths.

Figure 5:
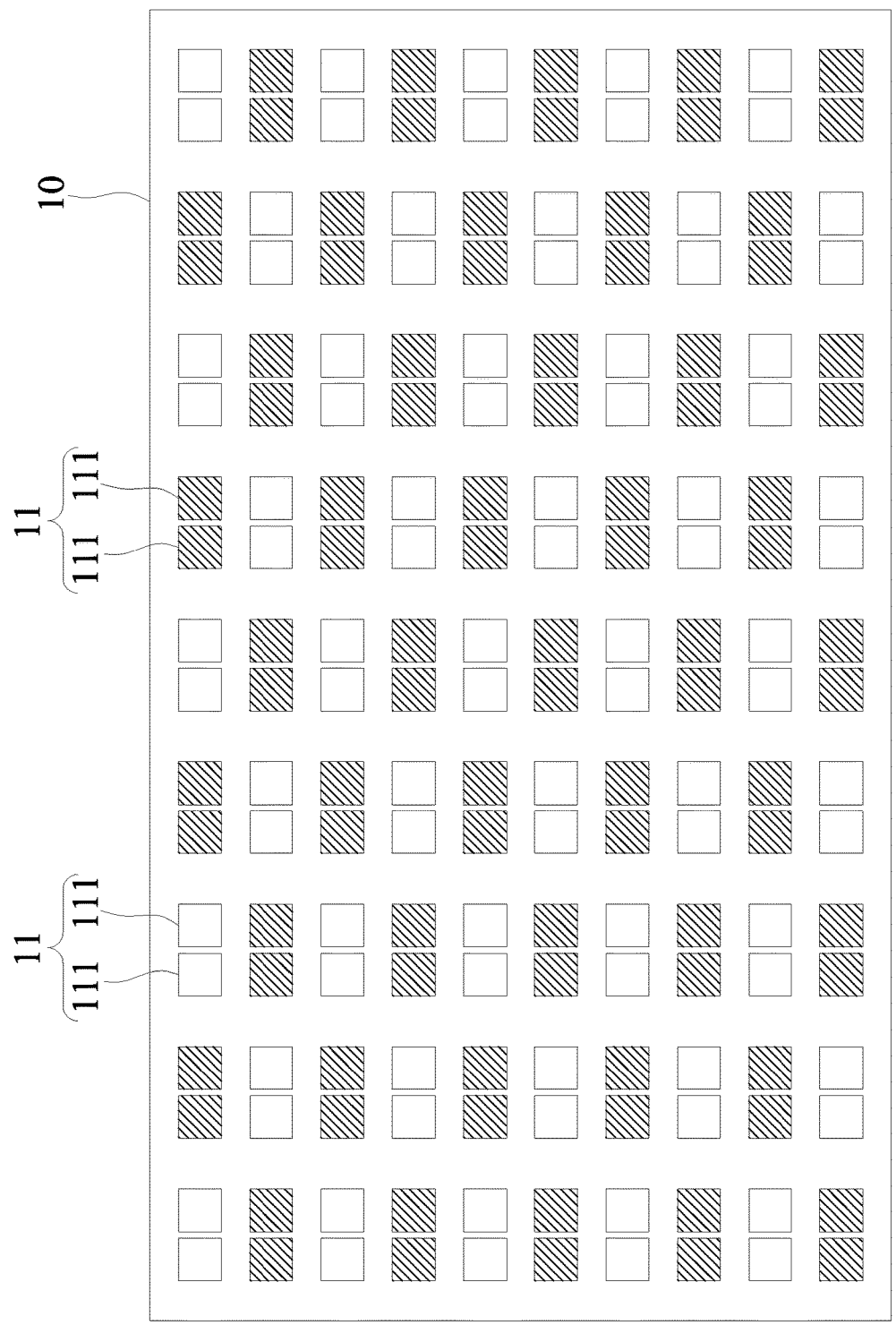
FIG. 5 is a third schematic view of schematic view of a carrier board and a micro LED array disposed on the carrier board in accordance with an embodiment of the present invention.

The micro LED arrays 11 emit lights of the same light color. Specifically, the micro LED arrays 11 emit lights of different light colors as shown in FIG. 5 and each of the micro LED arrays 11 is formed by one or more micro LEDs 111. For example, the micro LED array 11 has one the micro LED 111 capable of emitting a blue light, one micro LED 111 capable of emitting a violet light, and one micro LED 111 capable of emitting a violet light and a ultraviolet light, so that the micro LED arrays 11 can emit lights of different light colors, or the micro LED arrays 11 have two micro LEDs 111 capable of emitting a blue light and two micro LEDs 111 capable of emitting a violet light.

The micro LED array 11 of the LED lighting module 1 of the present invention may be designed according to different purposes. For example, when a backlight source is used, the required resolution of the display may be adjusted. In addition, the phosphor film 12 does not just refer to the phosphor powder material disposed on the transparent substrate 121 only. More precisely, it refers to the plurality of light emitting regions 122 defined on the phosphor film 12, so that the micro LED arrays 11 have a complete collimation. Understandably, after the micro LED arrays 11 emit lights, the lights entering into the light emitting region 122 are collimated as much as possible, and the light emitting region 122 may or may not have the phosphor powder 123. For example, the blue diode produces blue light, and the light emitting region 122 no longer needs the phosphor powder to maintain the blue light performance in a certain region anymore, or when a blue light is used for exciting the substrate of the phosphor powder, the light emitting region 122 may be added with a green phosphor powder or a red phosphor powder, wherein the material may also be a quantum dot. Even if a micro blue diode is used as the light emitting source, some of the light emitting regions without phosphor powder, and some of the light emitting regions with the green and red phosphor powder will be able to produce different light color expressions. In addition, the phosphor films 12 may be stacked with one another. To improve the color rendering requirement and absorb different phosphor powders of different wavelengths or prevent a secondary absorption, the single micro LED array 11 of the present invention may be formed by violet and ultraviolet light LEDs of two different wavelengths; or the micro LED arrays 11 may be formed by two different phosphor powders or their mixture to emit different light colors.

Figure 7:
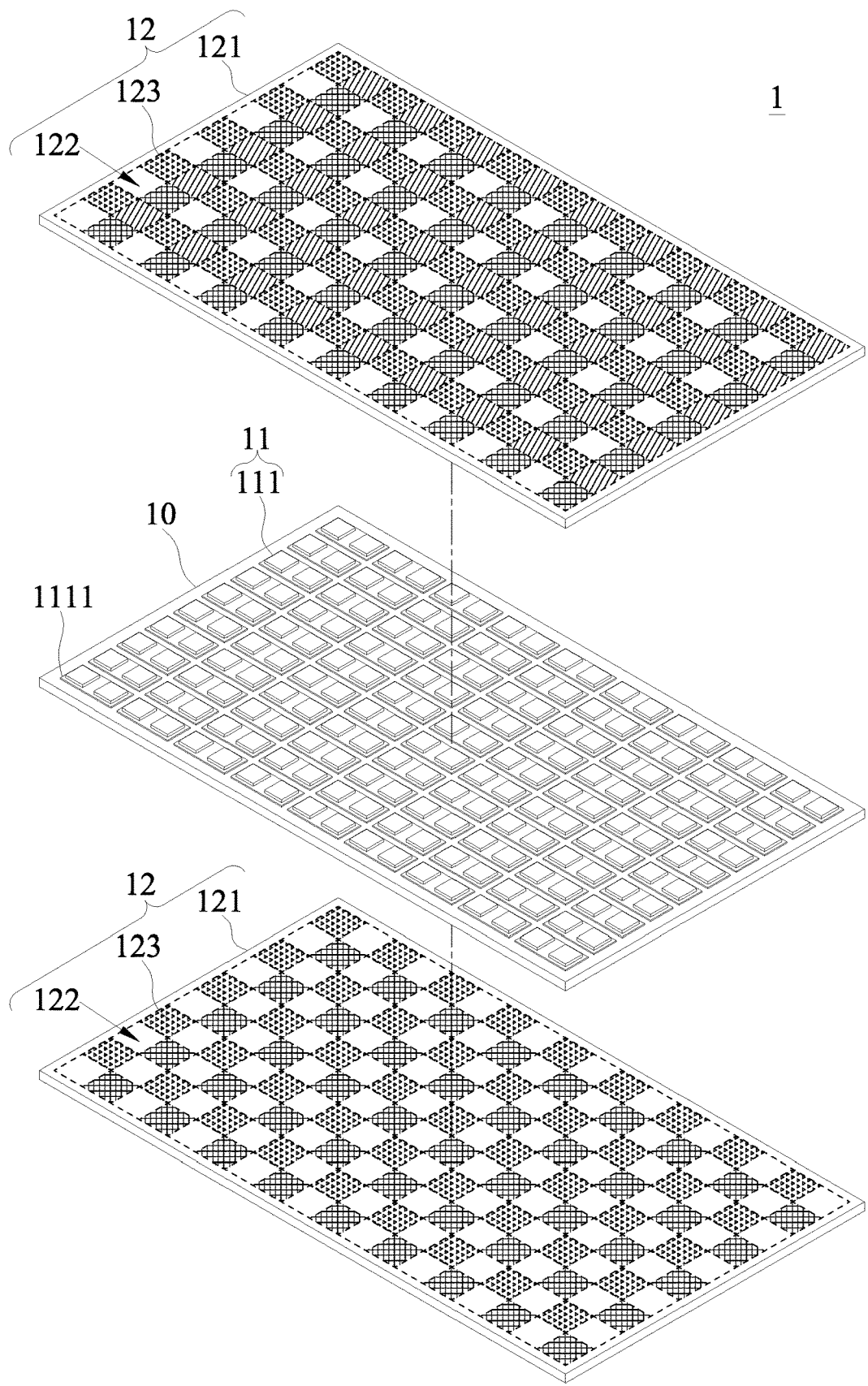
FIG. 7 is a second exploded view of a phosphor film, a micro LED array, and a carrier board in accordance with an embodiment of the present invention.

Preferably, when each of the micro LED arrays 11 comprising at least two coupled micro LEDs 111, and the at least two coupled micro LEDs 111 are formed on the same substrate 1111. Since the assembly of the micro LED arrays 11 is very small, therefore a plurality of light emitting elements with an electrical connection relation with respect to one another can be produced in a manufacturing process to further reduce the intervals of the micro LEDs 111. In the meantime, the manufacturing process can make the light emitting style of each light emitting element more consistent to facilitate a later use of the LED arrays. Particularly, when the LED lighting module is applied to a display, the effect and performance become more important. To improve the transparency of the LED lighting module 1 and achieve a double-sided light output effect, the transparent substrate 1111 and the carrier board 10 are made of a transparent material. When the transparent substrate 1111 and the carrier board 10 are made of a transparent material, both sides of the micro LED array 11 may have the phosphor film 12 to enhance the function of the LED lighting module 1 and extend its scope of applicability as shown in FIG. 7. At present, there are various types of light sources, a full-cycle light is quite common, so that when the micro LED arrays 11 emit full-cycle lights, the phosphor film 12 may be attached onto both sides of the micro LED arrays 11, or even attached on both sides to achieve the desired light emitting status and to provide a light output with different light color expressions on both sides.

To let the light emitting regions 122 having the phosphor film 12 with the phosphor powder 123 have a better excitation efficiency and a better light color expression, this preferred embodiment adopts the phosphor powder 123 which is a quantum dot or a powder particle of the phosphor powder 123, wherein there are at least 20 particles at the positions of the single light emitting region 122, so that the light of the micro LED arrays 11 has a better excitation performance, and the output light color has a better color saturation. In addition, the transparent substrate 121 of the phosphor film 12 is made of a material selected from PET, PMMA, PC or glass to provide better transparency and protection function.

Figure 8:
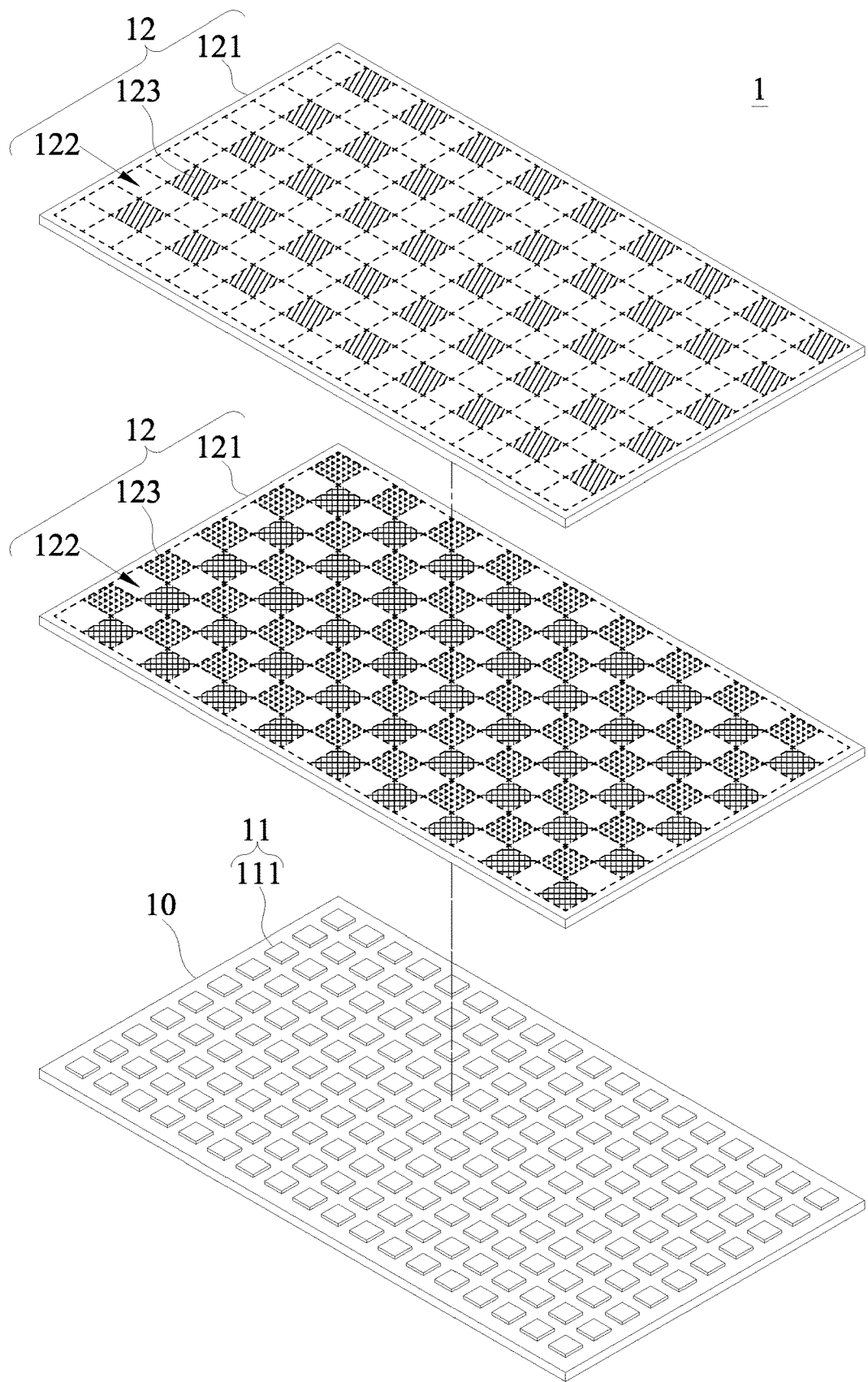
FIG. 8 is a third exploded view of a phosphor film, a micro LED array, and a carrier board in accordance with an embodiment of the present invention.

With reference to FIG. 8 for the third exploded view of an LED lighting module including a phosphor film, a micro LED array and a carrier board in accordance with an embodiment of the present invention, the LED lighting module 1 may use a single phosphor film 12 to achieve the effect of adjusting the output light color of the micro LED array 11, or when the phosphor film 12 comes with a quantity of two or more, the phosphor films 12 are vertically stacked on a same side and configured to be corresponsive to the phosphor films 12 at the collimated positions of the micro LED arrays 11, and the position of the phosphor powder 123 of each of the phosphor films 12 is vertically staggered. With several layers of phosphor films 12, the light color expression of each of the micro LED arrays 11 can be adjusted for diversified applications.

Figure 6:
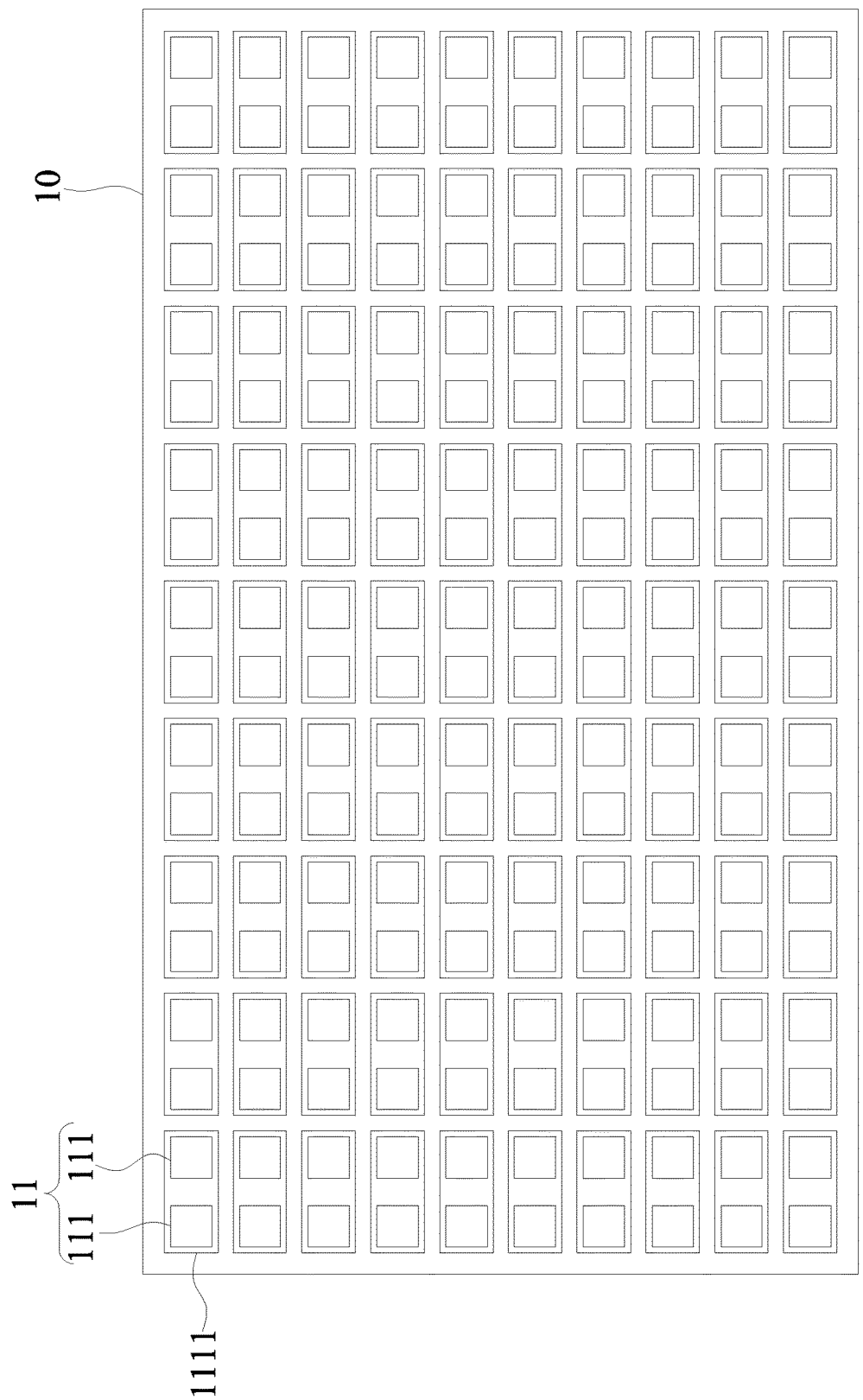
FIG. 6 is a fourth schematic view of a carrier board and a micro LED array disposed on the carrier board in accordance with an embodiment of the present invention.

In the implementation mode of this structure, the micro LED arrays 11 may emit lights of the same light color or lights of different light colors. When the micro LED arrays 11 emit lights of the same light color, each of the micro LED arrays 11 is formed by one of the micro LEDs 111 (as shown in FIG. 7), or each of the micro LED arrays 111 is formed by two or more micro LEDs 111 of the same light emitting wavelength (as shown in FIG. 3), or each of the micro LED arrays 11 is formed by two or more micro LEDs 111 of different light emitting wavelengths (as shown in FIG. 4). When the micro LED arrays 11 emit lights of different light colors, each of the micro LED arrays 11 is formed by one of the micro LEDs 111, or two or more micro LEDs 111 of the same or different light emitting wavelengths (as shown in FIG. 5). When each of the micro LED arrays 11 comprising at least two coupled micro LEDs 111, and the at least two coupled micro LEDs 111 are formed on the same substrate 1111 (as shown in FIG. 6), so as to meet the requirement of a substantially uniform light color style.

Similarly, the phosphor powder 123 is formed on the light emitting regions 122 of the transparent substrate 121 by a spraying, printing, evaporation, or sputtering method, and the phosphor powder 123 may be a quantum dot or a powder particle of the phosphor powder 123, wherein there are 20 or more particles at the positions in the single light emitting region 122. In addition, the transparent substrate 121 is made of a material selected from PET, PMMA, PC or glass. The remaining related details, technical characteristics, and effects of the invention have been described above and thus will not be repeated.

Figure 9:
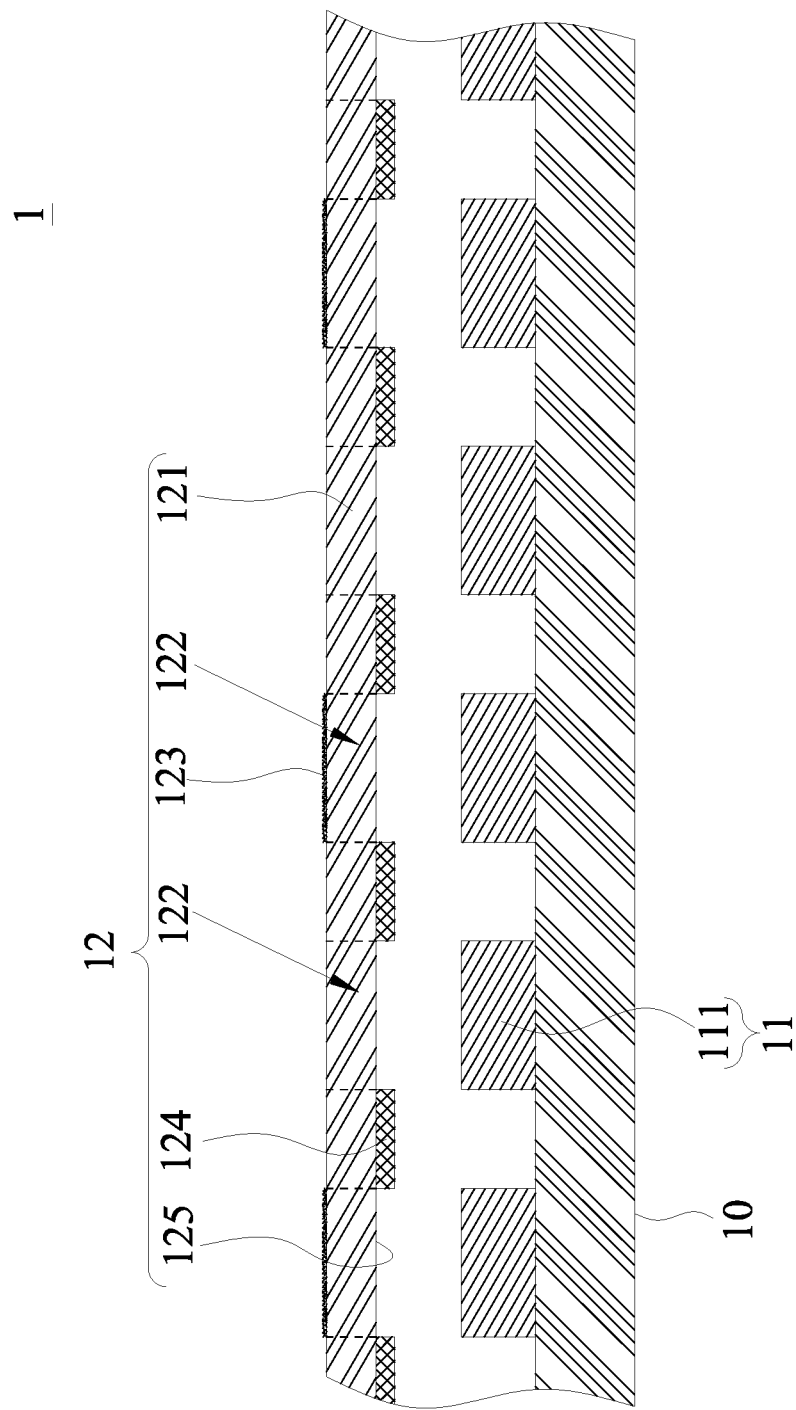
FIG. 9 is a first schematic view of a phosphor film having a barrier in accordance with an embodiment of the present invention.
Figure 10:
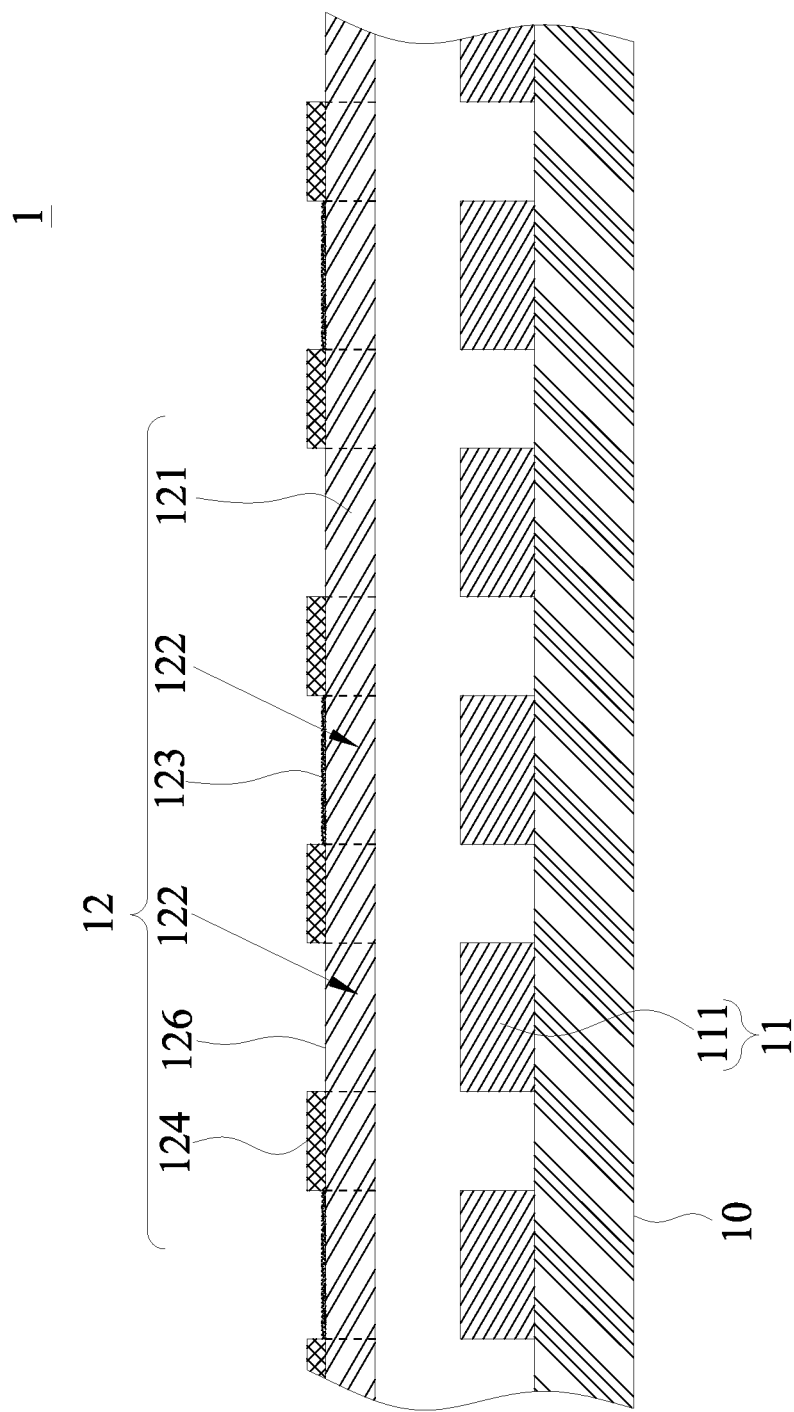
FIG. 10 is a second schematic view of a phosphor film having a barrier in accordance with an embodiment of the present invention.
Figure 11:
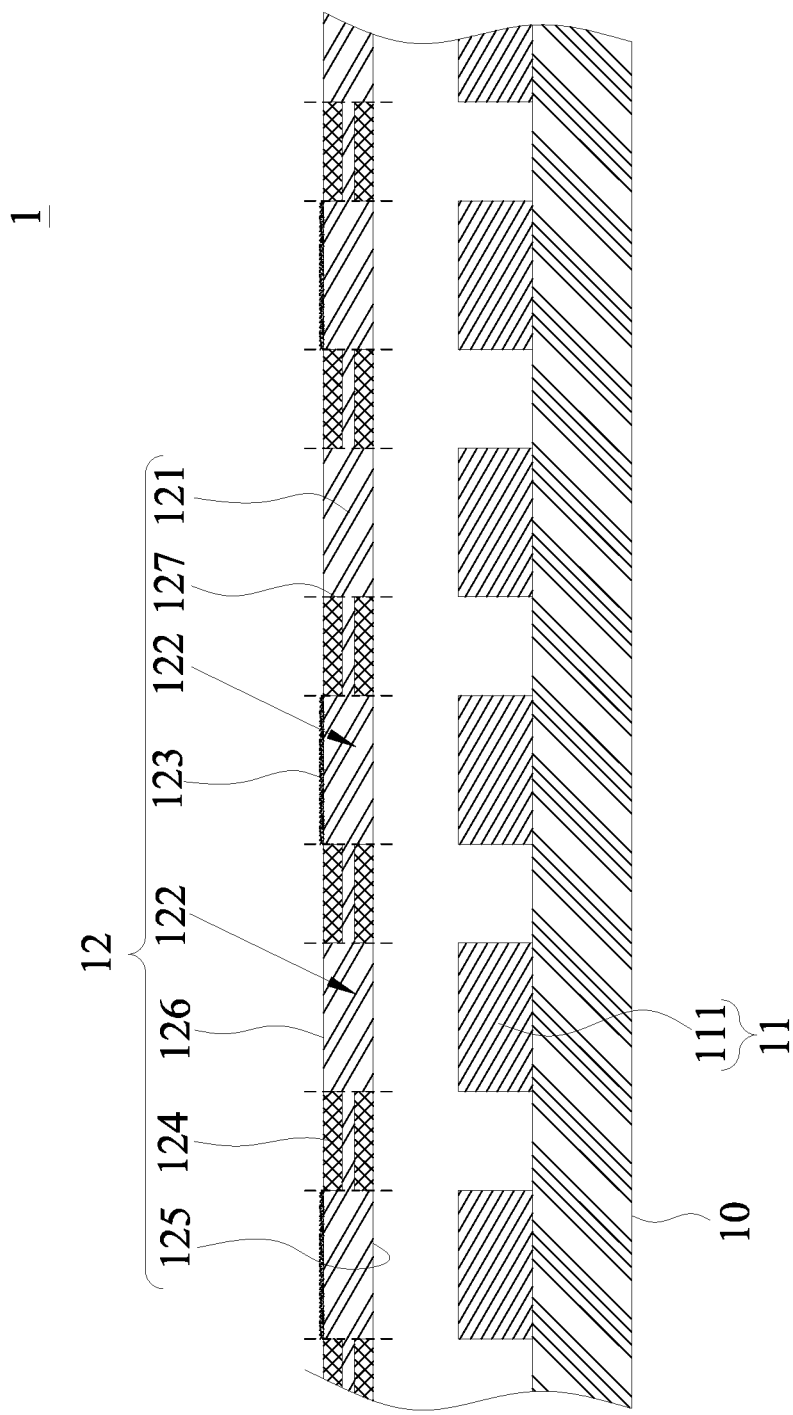
FIG. 11 is a third schematic view of a phosphor film having a barrier in accordance with an embodiment of the present invention.

With reference to FIGS. 9, 10 and 11 for the first, second and third schematic views of a phosphor film with a barrier in accordance with the first embodiment of the present invention respectively, the invention eliminates any unexpected light color expression caused by light spillage and interference when the light is emitted from each of the micro LED arrays 11 and projected onto the phosphor film 12. To achieve such effect, the LED lighting module has a plurality of barriers 124 formed at a lower surface 125 of the phosphor film 12 and configured to be corresponsive to micro LED arrays 11 respectively, and the barriers 124 are situated between the light emitting regions 122 for preventing the light emitted from the micro LED arrays 11 from spilling to the non-collimated position of the light emitting region 122 as shown in FIG. 9, or the LED lighting module has a plurality of barriers 124 formed at an upper surface 126 of the phosphor film 12 and configured to be opposite to the micro LED arrays 11, and the barriers 124 are situated between the light emitting regions 122 for preventing the light emitted from the micro LED arrays 11 from spilling to the non-collimated position of the light emitting region 122 as shown in FIG. 10, or the LED lighting module has a plurality of barriers 124 formed at an upper surface 126 and a lower surface 125 of the phosphor film 12 and configured to be opposite to the micro LED arrays 11, and the barriers 124 are situated between the light emitting regions 122 for preventing the light emitted from the micro LED arrays 11 from spilling to the non-collimated position of the light emitting region 122 as shown in FIG. 11. The design of the barriers 24 on the upper surface 125 or the lower surface 126 of the phosphor film 12, or on both upper and lower surfaces 125, 126 of the phosphor film 12 can effectively prevent the lights emitted from the micro LED arrays 11 from spilling into the non-collimated position and affecting the light output of any one of the light emitting regions 122, so that the light of each of the micro LED arrays 11 can be collimated and used by the corresponding light emitting region 122.

Specifically, the barriers 124 are formed on the phosphor film 12 by a spraying, printing, evaporation, or sputtering method to facilitate a quick formation of the barriers 124 at specified positions of the phosphor film 12. In addition, the barriers 124 may be protruded from the surface of the phosphor film 12 or aligned evenly with the surface of the phosphor film 12. As shown in FIGS. 9 and 10, the barriers 124 are slightly protruded from the surface of the phosphor film 12. To extend the barriers 124 into the interior of the phosphor film 12, the phosphor film 12 has a plurality of grooves 127, and a photoresist material is filled into the grooves 127 to form the barriers 124, and the photoresist material may be a black material such as ink as shown in FIG. 11, and the barriers 124 is in a coplanar status with respect to the surface of the phosphor film 12.

Figure 12:
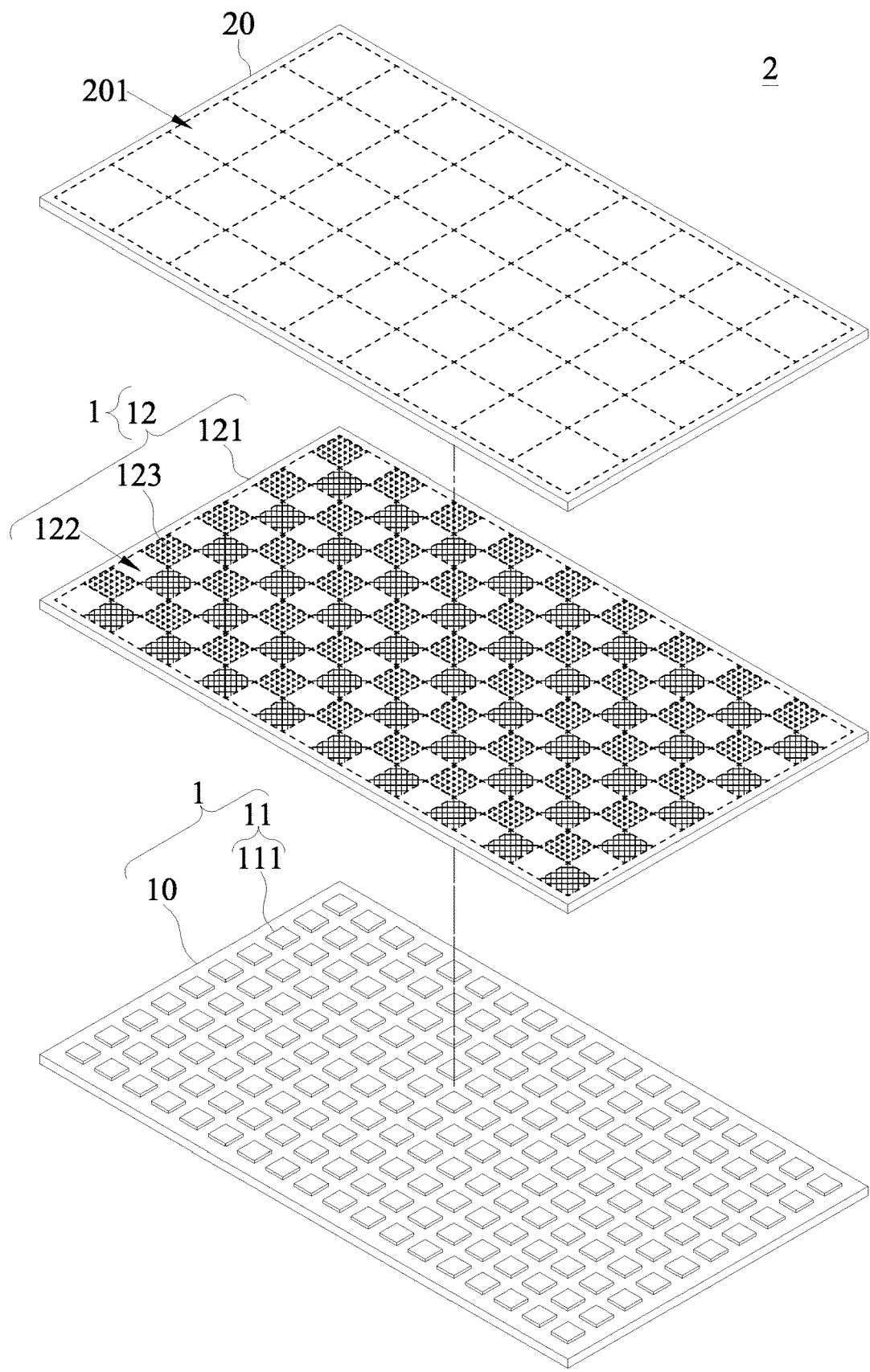
FIG. 12 is an exploded view of a display in accordance with an embodiment of the present invention.

With reference to FIG. 12 for an exploded view of a display in accordance with an embodiment of the present invention as well as FIGS. 1 to 7, it is noteworthy that the same numerals are used for representing the same elements as described above, and the present invention discloses a display 2 comprising at least one display panel 20 and a LED lighting module 1. The display panel 20 has a plurality of pixel units 201, and the display panel 20 is preferably a highly transparent sheet structure, and the display panel 20 does not refer to the convention LCD display panel. The LED lighting module 1 comprises a carrier board 10, a plurality of micro LED arrays 11 and at least one phosphor film 12. The resolution (or the number of pixels) of the display may be adjusted according to different resolution conditions of the pixel unit 201 of the present invention. In other words, the pixel unit 201 is a concept of a single pixel.

The micro LED arrays 11 are installed onto the carrier board 10, and the micro LED arrays 11 are formed by at least one micro LED 111, wherein the distance between two adjacent micro LED arrays 11 is preferably 1 pitch, wherein 1 pitch is defined as a length smaller than 1 mm, so that the LED lighting module 1 can provide a better light emitting efficiency and a better light output performance. The phosphor film 12 is installed on a side of the micro LED arrays 11, wherein the phosphor film 12 has a transparent substrate 121 which is a one-piece structure, and the transparent substrate 121 has a plurality of light emitting regions 122 defined thereon, and the light emitting regions 122 are arranged adjacent to one another and into a matrix form and configured to be corresponsive to the collimated positons of the micro LED arrays 11, and at least one phosphor powder 123 is deposited on a part or the whole of the surface of the light emitting regions 122 and the single light emitting region 122 with the phosphor powder 123 and the phosphor powder 123 may have a substantially uniform thickness, so as to let the light emitting regions 122 have different light color expressions; wherein each of the pixel units 20 is configured to be corresponsive to the positions of at least three adjacent light emitting regions 122. Therefore, when the display 2 displays a screen, the individually addressable micro LED arrays 11 together with the entire-surface and separated light emitting regions 122 of the phosphor films 12 can provide the light color expression of each pixel unit according to the desired individual addressing control of the display 2, so as to enhance the resolution and the response speed of the display 2 significantly while reducing the overall thickness and improving the convenience of installation. The remaining details and technical characteristics of the LED lighting module 1 have been described above and thus will not be repeated.

Specifically, after the light emitting regions 122 corresponding to the pixel unit 201 receive the light of the micro LED arrays 11, red, green and blue light colors can be shown. The micro LED arrays 11 emit lights of the same or different light colors as shown in FIG. 11. For example, the micro LED arrays 11 may emit lights of the same light color, and each of the micro LED arrays 11 is formed by one micro LED 111. The micro LED arrays 11 may emit lights of the same light color, and each of the micro LED arrays 11 is formed by two or more micro LEDs 111 of the same light emitting wavelength as shown in FIG. 3. The micro LED arrays 11 may emit lights of the same light color, and each of the micro LED arrays 11 is formed by two or more micro LEDs 111 of different light emitting wavelengths as shown in FIG. 4. When the micro LED arrays 11 emit lights of different light colors, the micro LED arrays 11 are made of one of the micro LEDs 111 or two or more micro LEDs 111 of the same light emitting wavelength, or two or more micro LEDs 111 of different light emitting wavelengths as shown in FIG. 5. The micro LED array 11 of the LED lighting module 1 of the present invention is designed for different purposes. For example, a backlight source is used and the desired resolution of the display may be adjusted. In addition, the phosphor film 12 does not just refer to the transparent substrate 121 having the phosphor powder material only. More precisely, the phosphor film 12 has the plurality of light emitting regions 122 defined thereon, so that a full collimation of the micro LED arrays 11 is achieved. Understandably, after the micro LED arrays 11 emit lights, the lights entering into the light emitting region 122 are collimated as much as possible, and the light emitting region 122 may or may not have the phosphor powder 123. For example, the blue diode produces blue light, and the light emitting region 122 no longer needs the phosphor powder to maintain the blue light performance in a certain region anymore, or when a blue light is used for exciting the substrate of the phosphor powder, the light emitting region 122 may be added with a green phosphor powder or a red phosphor powder, wherein the material may also be a quantum dot. Even if a micro blue diode is used as the light emitting source, some of the light emitting regions without phosphor powder, and some of the light emitting regions with the green and red phosphor powder will be able to produce different light color expressions. In addition, the phosphor films 12 may be stacked with one another. To improve the color rendering requirement and absorb different phosphor powders of different wavelengths or prevent a secondary absorption, the single micro LED array 11 of the present invention may be formed by violet and ultraviolet light LEDs of two different wavelengths; or the micro LED arrays 11 may be formed by two different phosphor powders or their mixture to emit different light colors.

Similarly, the phosphor powder 123 of the phosphor film 12 of the LED lighting module 1 may be formed on the light emitting regions 122 of the transparent substrate 121 by a spraying, printing, evaporation, or sputtering method to quickly form the structure with the required distributed light emitting regions 122 and facilitate forming a uniform thickness for the phosphor powder 123 in the single light emitting region 122.

In addition, when each of the micro LED arrays 11 comprising at least two coupled micro LEDs 111, and the at least two coupled micro LEDs 111 are formed on the same substrate 1111 as shown in FIG. 6. Since the assembly of the micro LED arrays 11 is very small, therefore a plurality of light emitting elements with an electrical connection relation with respect to one another can be produced in a manufacturing process to further reduce the intervals of the micro LEDs 111. In the meantime, the manufacturing process can make the light emitting style of each light emitting element more consistent to facilitate a later use of the LED arrays. Particularly, when the LED lighting module is applied to a display, the effect and performance become more important.

On the other hand, when the phosphor film 12 comes with a quantity of two or more, the phosphor films 12 are vertically stacked on the same side and configured to be corresponsive to the collimated positions of the phosphor films 12 of the micro LED arrays 11 and the positions of the phosphor powders 123 on the phosphor films 12 are vertically staggered. In FIG. 7, the multiple layers of the phosphor film 12 achieve a finer light color adjustment effect. With the structure of having the phosphor films 12 vertically stacked, the micro LED arrays 11 may be configured as shown in FIGS. 3 to 6, and the detailed technical characteristics have been described above, and thus will not be repeated.

Figure 13:
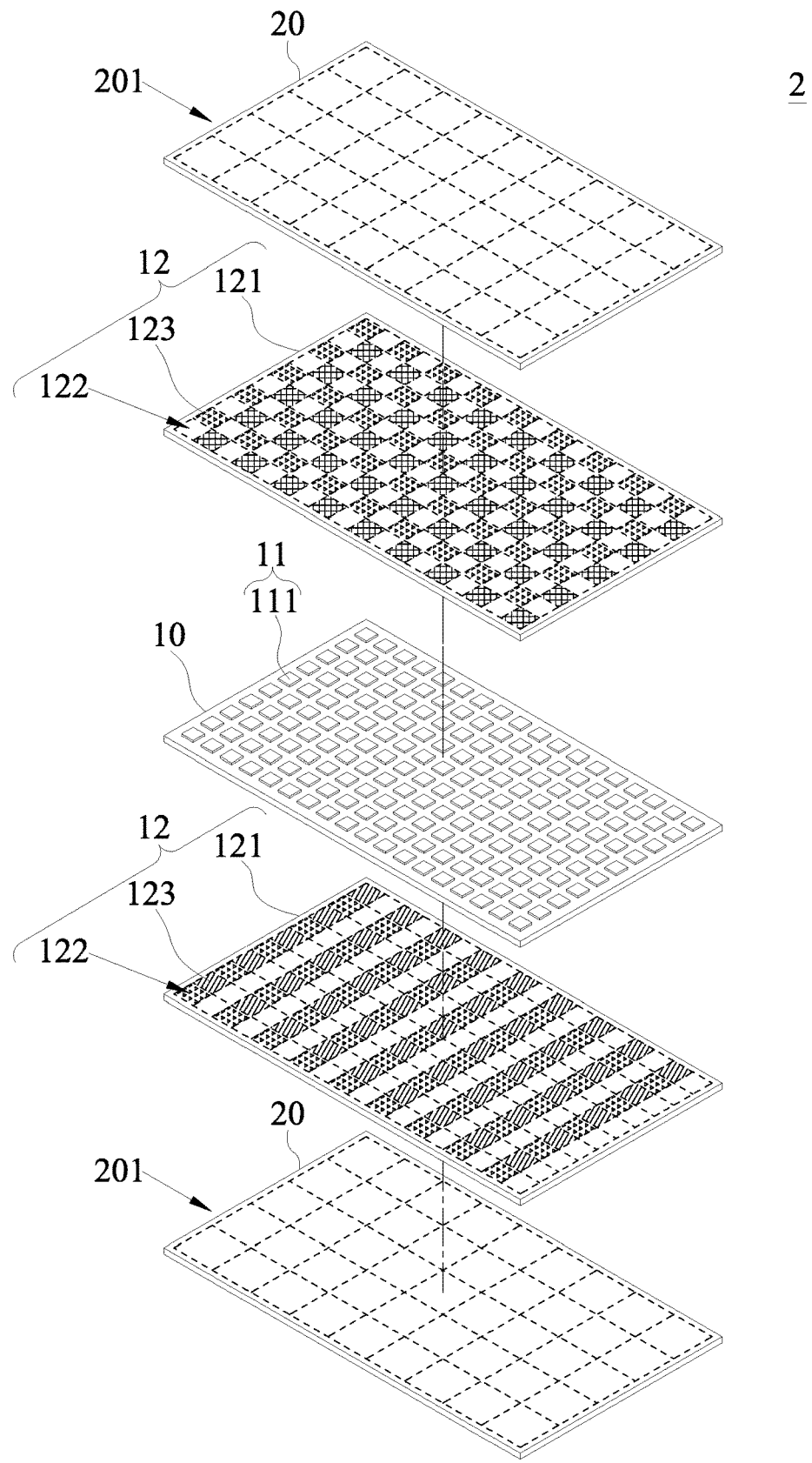
FIG. 13 is an exploded view of a double-sided display having a display panel installed separately to both sides of an LED lighting module in accordance with an embodiment of the present invention.
Figure 14:
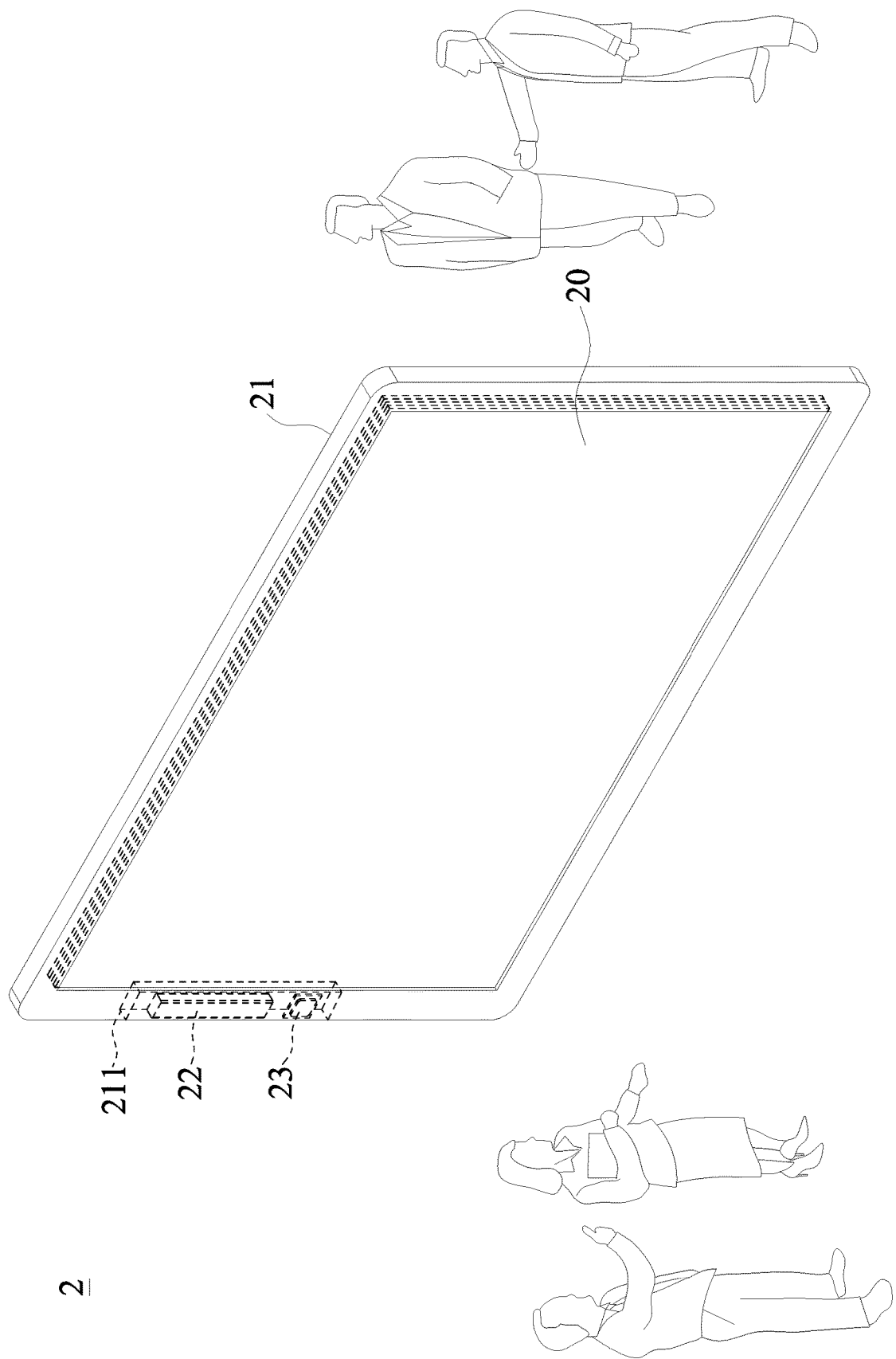
FIG. 14 is a schematic view of a display with a frame in accordance with an embodiment of the present invention.
Figure 15:
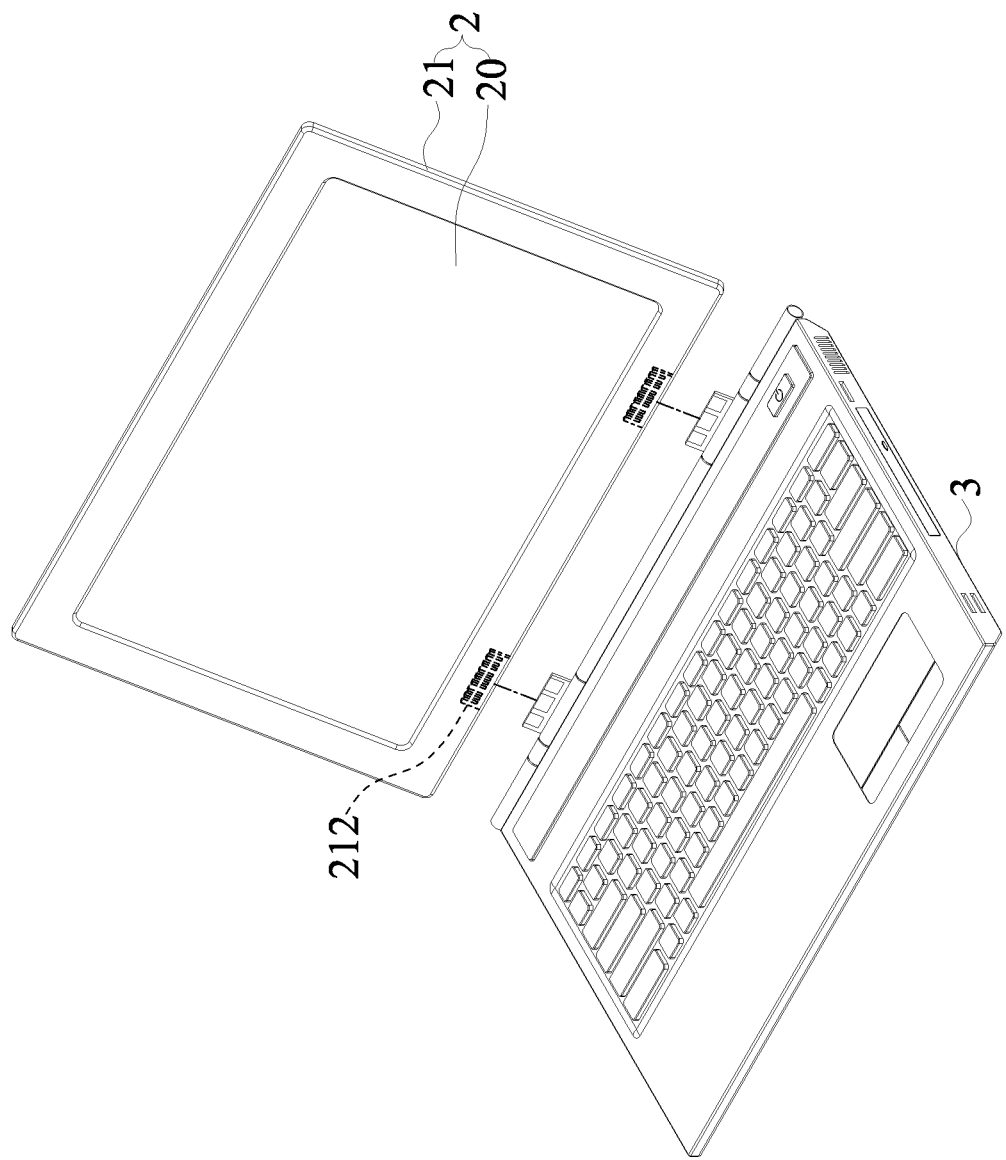
FIG. 15 is a schematic view of an application of the display with the frame provided for connecting an electronic device in accordance with an embodiment of the present invention.

With reference to FIGS. 13, 14 and 15 for an exploded view of a double-sides display having a display panel using an LED lighting module on both sides of the display, a schematic view of the display with a frame, and a schematic view of applying the display with a frame for connecting an electronic device in accordance with an embodiment of the present invention respectively, the transparent substrate 1111 and the carrier board 10 are preferably made of a transparent material in order to have a transparent display, so as to enhance the transparency of the LED lighting module 1. At present, there are various types of light sources, a full-cycle light is quite common, so that when the micro LED arrays 11 emit full-cycle lights, the phosphor film 12 may be attached onto both sides of the micro LED arrays 11, or even attached on both sides to achieve the desired light emitting status and to provide a light output with different light color expressions on both sides. Therefore, if the transparent substrate 1111 and the carrier board 10 are made of a transparent material, the display 2 will serve as a transparent display, and the LED lighting module 1 will be able to provide a double-sided light output performance due to the transparent material. Both sides of the micro LED array 11 may have the phosphor film 12, and both sides of the LED lighting module 1 may have the display panel 20, so that the display 2 has a double-sided display effect as shown in FIG. 14, and users may view different screens from both sides of the display panel 20.

It is noteworthy that the conventional double-sided display just provides two independent single-sided displays and combines the two single-sided display, but has no contribution to the thin design or energy saving. On the other hands, the double-sided display of the present invention when not being turned on is situated in a transparent glass form. Once the double-sided display is turned on, the same light emitting source of a full-cycle light can be used as backlight, and the images displayed on both sides of the double-sided display can be stacked to provide the same light output performance; or the phosphor films are stacked in a different way to allow both sides to have different light output performances. Such product is a revolutionary product used extensively in the areas of exhibitions, special advertising billboards, or even major sports events and various types of performances The display 2 further comprises a frame 21 provided for installing the display panel 20 and the LED lighting module 1, and at least one receiving groove 211 formed on an inner side of the frame 21 and disposed at a lateral side of the display panel 20 and the LED lighting module 1 for accommodating a power supply module 22 and a processing module 23 which are electrically coupled to the LED lighting module 1. With the frame 21, the power supply module 22 and the processing module 23 can be hindered in the frame 21 to reduce the thickness of the display 1 effectively and prevent the power supply module 22 and the processing module 23 from being exposed to the outside and affecting the external look of the display 2. In addition, the processing module 23 is installed in the display 2, so that the display 2 has the display and processing functions, and the display 2 is not just used for display only. Further, the display panels 20 may be touch panels telecommunicatively coupled to the processing module 23, so that the display 2 can display screens and provide a touch control for operating the display 2. To provide a better color saturation for the light output light color of the LED lighting module 1, the phosphor powder 123 may be a quantum dot or a powder particle of the phosphor powder 123, wherein there are at least 20 particles at the positions in the single light emitting region 122. To provide a better transparency and a better protection effect of the phosphor film 12, the transparent substrate 121 is preferably made of PET, PMMA, PC or glass. Of course, the phosphor powder 123 and the transparent substrate 121 are not limited to the aforementioned arrangement only, but the LED lighting module 1 may have the display panel 20 on a single side.

In FIG. 15, the display 2 may be used simply for display only. In this case, the display 2 may further comprise the frame 21 for installing the display panel 20 and the LED lighting module 1, and the frame 21 has at least one port 212 electrically coupled to the LED lighting module 1 and provided for telecommunicatively connecting an electronic device 3. Therefore, the display 2 can be telecommunicatively coupled to the electronic device 3 such as a computer host through the port 212 to control and operate the electronic device 3 externally and the display 2 is controlled by the electronic device 3 to display a screen or perform an operation.

Figure 16:
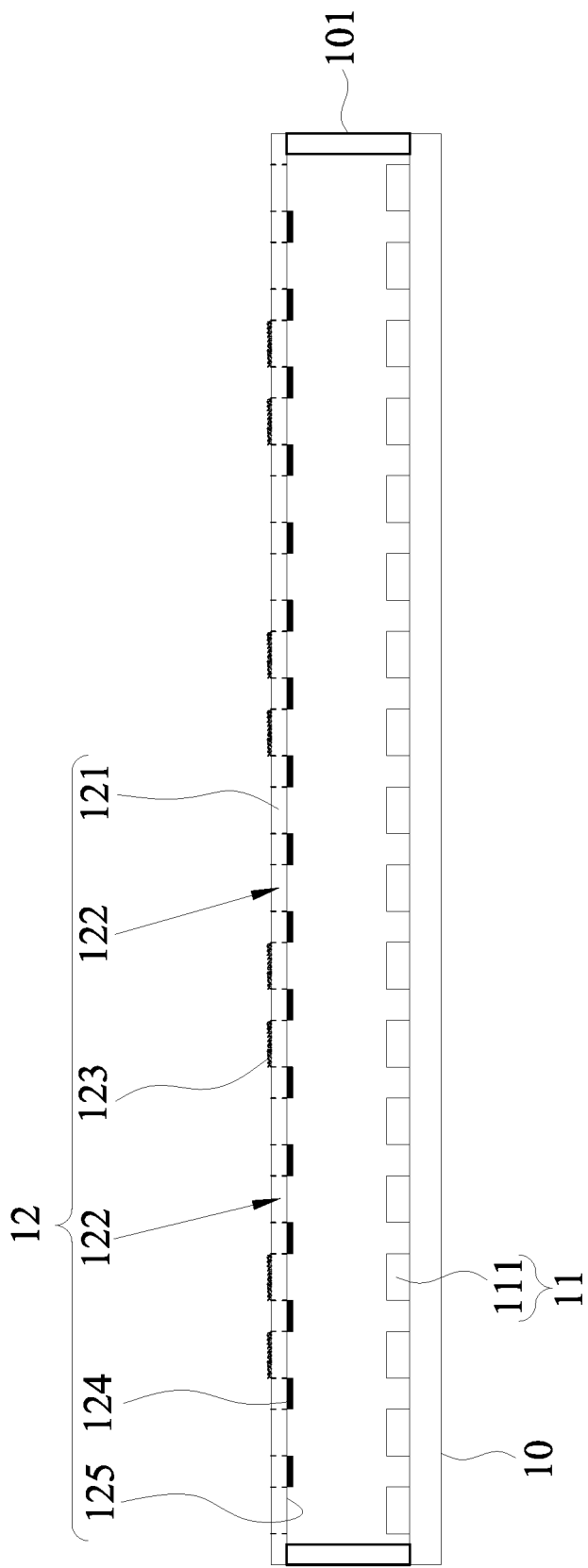
FIG. 16 is a first schematic view of assembling a phosphor film with a barrier and a carrier board in accordance with an embodiment of the present invention.
Figure 17:
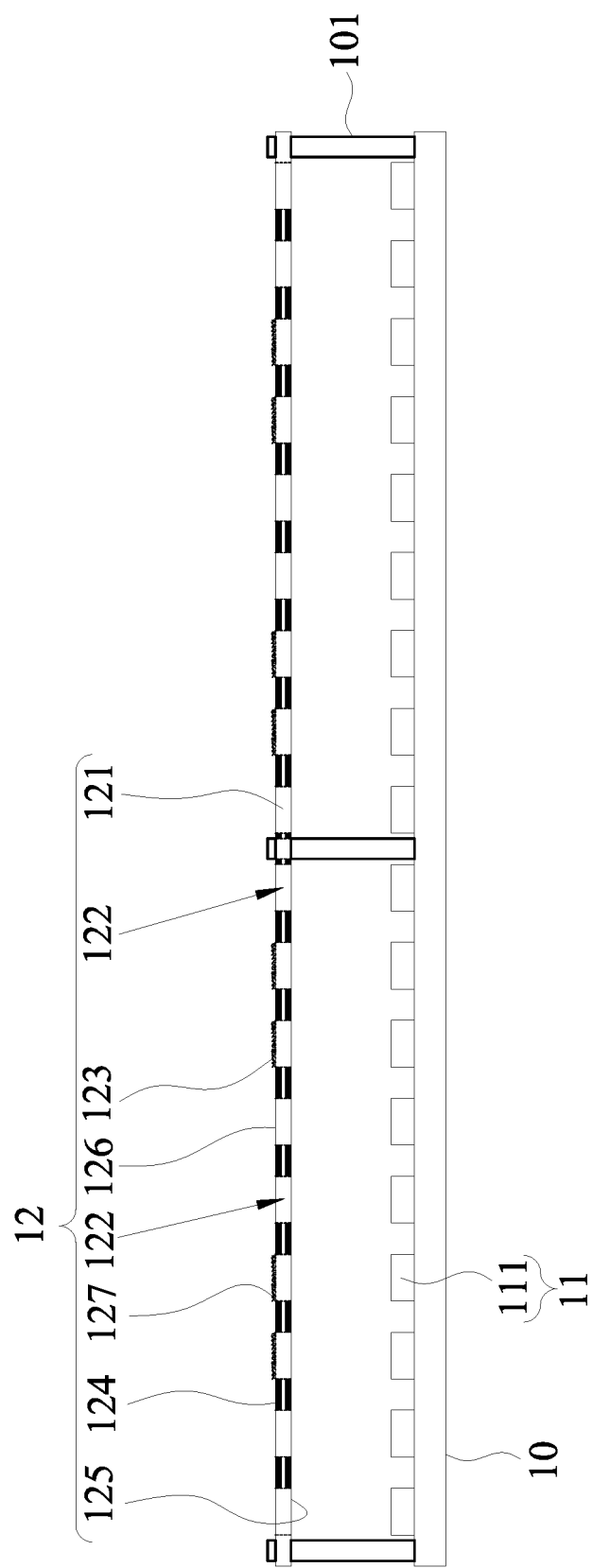
FIG. 17 is a second schematic view of assembling a phosphor film with a barrier and a carrier board in accordance with an embodiment of the present invention.

With reference to FIGS. 16 and 17 for the first and second schematic views of assembling a phosphor film with a barrier and a carrier board in accordance an embodiment of the present invention respectively, as well as FIGS. 9 to 11, the phosphor film 12 may have a plurality of barriers 124 formed thereon to enhance the accuracy of the light color expression after the micro LED arrays 11 outputs light from each of the light emitting regions 122 and prevent the light of each of the micro LED arrays 11 from spilling to other non-collimated position of the light emitting regions 122. In a preferred embodiment, the barriers 124 are formed on a lower surface 125 of the phosphor film 12 and opposite to the micro LED arrays 11 respectively, and the barriers 124 are situated between the light emitting regions 122 for preventing the light emitted from the micro LED arrays 11 from spilling to the non-collimated position of the light emitting region 122 as shown in FIG. 9 or 16; or the barriers 124 are formed on an upper surface 126 of the phosphor film 12 and opposite to the micro LED arrays 11, and the barriers 124 are situated between the light emitting regions 122 for preventing the light emitted from the micro LED arrays 11 from spilling to the non-collimated position of the light emitting region 122 as shown in FIG. 10; or the barriers 124 are formed on an upper surface 125 and a lower surface 126 of the phosphor film 12 and opposite to the micro LED arrays 11, and the barriers 124 are situated between the light emitting regions 122 for preventing the light emitted from the micro LED arrays 11 from spilling to the non-collimated position of the light emitting region 122 as shown in FIG. 11 or 17. With the aforementioned structures of the barriers 124, the light emitted from the micro LED arrays 11 can be prevented from spilling into the non-collimated positions of the corresponding light emitting regions 122, so as to prevent any unexpected light color expression. Preferably, the barriers 124 are formed on the phosphor film 12 by a spraying, printing, evaporation, or sputtering method to quickly and accurately form the barriers 124 according to the distribution of the phosphor films 12. In addition, the phosphor film 12 has the grooves 127 filled with the photoresist material to form the barriers 124, and the barriers 124 may be protruded form a lower surface 125 or an upper surface 126 of the phosphor film 12, or aligned evenly with the surface of the phosphor film 12 to provide a coplanar status.

In FIG. 16, at least one fastener 101 is installed at an edge of the carrier board 10 for fixing the relative positions of the carrier board 10 and the phosphor film 12, so that the light emitting regions 122 corresponding to the micro LED arrays 11 can be maintained at the collimation configuration, wherein the carrier board 10 have a plurality of fasteners 101, and the fasteners 101 are disposed at each edge of the carrier board 10 and with an interval apart from one another, or the fasteners 101 are disposed on any one or two edges only. In addition, an end of the fastener 101 coupled to the phosphor film 12 is attached and fixed onto the surface of the phosphor film 12, so that the phosphor film 12 can be maintained at a collimation configuration with respect to the micro LED arrays 11. In FIG. 17, the fasteners 101 may be passed through the phosphor film 12 and fixed, so that the carrier board 10, the micro LED arrays 11, and the light emitting regions 122 can be maintained at a collimation configuration.

In summation of the description above, the LED lighting module and the display applying the LED lighting module in accordance with the present invention use a special design of the phosphor films to effectively make the micro LED arrays regardless of having a light color of a single wavelength or two or more light colors of different wavelengths as a light emitting source, and one or more phosphor films are stacked to provide different light output performances, and the application of the micro LED is no longer limited or fixed and the drawbacks of low efficiency or limited choice of the output light color are overcome. The invention provides a simple and easy structure and method of installing the phosphor powder to achieve the individual addressing and driving effects of the micro LED in order to provide different light colors. Unlike the conventional micro LED related technology, the key point of the present invention is to use a novel phosphor film technology to provide a better way of installing the phosphor powder to the micro LED. This invention can improve the application performance of micro LED significantly and reduce the production cost and inconvenience effectively while complying with the requirements of thin components. The present invention is totally different from the conventional micro LED manufacturing technology and mass transfer technology. The present invention also provides several solutions for the micro LED arrays and choices according to the application requirements, and the manufacturing process and material of the phosphor film are further limited to produce the LED lighting module with a better light output performance. In the display applying the LED lighting module, the power supply module and the processing module are hidden into the frame of the display to provide a better external look of the transparent display, and the display also has a processing function or just has the display function. In addition, the display can be connected to other external electronic devices for use.

What is claimed is:

1. An LED lighting module, comprising:
   a carrier board;
   a plurality of micro LED arrays, installed onto the carrier board, and composed of at least one micro LED; and
   at least one phosphor film, disposed on a side of the plurality of micro LED arrays, and having a transparent substrate and being a one-piece structure, a plurality of light emitting regions defined on the transparent substrate and arranged adjacent to one another and into an array arrangement and configured to be corresponsive to a collimation of the plurality of micro LED arrays, at least one phosphor powder disposed on a part or a whole of a surface of the plurality of light emitting regions, and the phosphor powder on a single light emitting region having a substantially uniform thickness, so that the plurality of light emitting regions have different light color expressions.

2. The LED lighting module of claim 1, wherein the plurality of micro LED arrays emit lights of the same light color respectively, and each of the plurality of micro LED arrays is formed by two or more micro LEDs with a same light emitting wavelength.

3. The LED lighting module of claim 1, wherein the plurality of micro LED arrays emit lights of the same light color respectively, and each of the plurality of micro LED arrays is formed by two or more micro LEDs of different light emitting wavelengths.

4. The LED lighting module of claim 1, wherein the plurality of micro LED arrays emit lights of different light colors.

5. The LED lighting module according to claim 1, wherein the phosphor powder is formed on the plurality of light emitting regions of the transparent substrate by a spraying, printing, evaporation, or sputtering method.

6. The LED lighting module of claim 5, wherein when each of the plurality of micro LED arrays is formed by two or more micro LEDs, the micro LEDs are formed on the same substrate and have a plurality of light emitting elements electrically coupled to one another.

7. The LED lighting module of claim 6, wherein the substrate and the carrier board are made of a transparent material.

8. The LED lighting module of claim 7, wherein the micro LED array has the phosphor film disposed on both sides of the micro LED array separately.

9. The LED lighting module of claim 8, wherein the phosphor powder is a quantum dot, or at least 20 particles of the phosphor powder are disposed in a single area of the light emitting region.

10. The LED lighting module of claim 9, wherein the transparent substrate is made of a material selected from the group consisting of PET, PMMA, PC and glass.

11. The LED lighting module according to claim 2, wherein the phosphor powder is formed on the plurality of light emitting regions of the transparent substrate by a spraying, printing, evaporation, or sputtering method.

12. The LED lighting module of claim 11, wherein when each of the plurality of micro LED arrays is formed by two or more micro LEDs, the micro LEDs are formed on the same substrate and have a plurality of light emitting elements electrically coupled to one another.

13. The LED lighting module of claim 12, wherein the substrate and the carrier board are made of a transparent material.

14. The LED lighting module of claim 13, wherein the micro LED array has the phosphor film disposed on both sides of the micro LED array separately.

15. The LED lighting module of claim 14, wherein the phosphor powder is a quantum dot, or at least 20 particles of the phosphor powder are disposed in a single area of the light emitting region.

16. The LED lighting module of claim 15, wherein the transparent substrate is made of a material selected from the group consisting of PET, PMMA, PC and glass.

17. The LED lighting module according to claim 3, wherein the phosphor powder is formed on the plurality of light emitting regions of the transparent substrate by a spraying, printing, evaporation, or sputtering method.

18. The LED lighting module of claim 17, wherein when each of the plurality of micro LED arrays is formed by two or more micro LEDs, the micro LEDs are formed on the same substrate and have a plurality of light emitting elements electrically coupled to one another.

19. The LED lighting module of claim 18, wherein the substrate and the carrier board are made of a transparent material.

20. The LED lighting module of claim 19, wherein the micro LED array has the phosphor film disposed on both sides of the micro LED array separately.

21. The LED lighting module of claim 20, wherein the phosphor powder is a quantum dot, or at least 20 particles of the phosphor powder are disposed in a single area of the light emitting region.

22. The LED lighting module of claim 21, wherein the transparent substrate is made of a material selected from the group consisting of PET, PMMA, PC and glass.

23. The LED lighting module according to claim 4, wherein the phosphor powder is formed on the plurality of light emitting regions of the transparent substrate by a spraying, printing, evaporation, or sputtering method.

24. The LED lighting module of claim 23, wherein when each of the plurality of micro LED arrays is formed by two or more micro LEDs, the micro LEDs are formed on the same substrate and have a plurality of light emitting elements electrically coupled to one another.

25. The LED lighting module of claim 24, wherein the substrate and the carrier board are made of a transparent material.

26. The LED lighting module of claim 25, wherein the micro LED array has the phosphor film disposed on both sides of the micro LED array separately.

27. The LED lighting module of claim 26, wherein the phosphor powder is a quantum dot, or at least 20 particles of the phosphor powder are disposed in a single area of the light emitting region.

28. The LED lighting module of claim 27, wherein the transparent substrate is made of a material selected from the group consisting of PET, PMMA, PC and glass.

29. The LED lighting module of claim 1, wherein when the phosphor film comes with a quantity of two or more, the phosphor films are stacked with each other vertically on a same side, and configured to be corresponsive to a collimating positions of the plurality of micro LED arrays respectively, and a positions of the phosphor powder on each of the phosphor films are staggered vertically.

30. The LED lighting module of claim 29, wherein the plurality of micro LED arrays emit lights of a same light color respectively, and each of the plurality of micro LED arrays is formed by two or more micro LEDs of a same light emitting wavelength.

31. The LED lighting module of claim 29, wherein the plurality of micro LED arrays emit lights of a same light color respectively, and each of the plurality of micro LED arrays is formed by two or more micro LEDs of different light emitting wavelengths.

32. The LED lighting module of claim 29, wherein the plurality of micro LED arrays emit lights of different light colors.

33. The LED lighting module according to claim 29, wherein the phosphor powder is formed onto the plurality of light emitting regions of the transparent substrate by a spraying, printing, evaporation, or sputtering method.

34. The LED lighting module of claim 33, wherein when each of the plurality of micro LED arrays is formed by two or more micro LEDs, the micro LEDs have a plurality of light emitting elements with an electrical connection relation and disposed on a same substrate.

35. The LED lighting module of claim 34, wherein the phosphor powder is a quantum dot, or at least 20 particles of the phosphor powder are disposed in a single area of the light emitting region.

36. The LED lighting module of claim 35, wherein the transparent substrate is made of a material selected from the group consisting of PET, PMMA, PC and glass.

37. The LED lighting module according to any one of claim 30, wherein the phosphor powder is formed onto the plurality of light emitting regions of the transparent substrate by a spraying, printing, evaporation, or sputtering method.

38. The LED lighting module of claim 37, wherein when each of the plurality of micro LED arrays is formed by two or more micro LEDs, the micro LEDs have a plurality of light emitting elements with an electrical connection relation and disposed on a same substrate.

39. The LED lighting module of claim 38, wherein the phosphor powder is a quantum dot, or at least 20 particles of the phosphor powder are disposed in a single area of the light emitting region.

40. The LED lighting module of claim 39, wherein the transparent substrate is made of a material selected from the group consisting of PET, PMMA, PC and glass.

41. The LED lighting module according to claim 31, wherein the phosphor powder is formed onto the plurality of light emitting regions of the transparent substrate by a spraying, printing, evaporation, or sputtering method.

42. The LED lighting module of claim 41, wherein when each of the plurality of micro LED arrays is formed by two or more micro LEDs, the micro LEDs have a plurality of light emitting elements with an electrical connection relation and disposed on a same substrate.

43. The LED lighting module of claim 42, wherein the phosphor powder is a quantum dot, or at least 20 particles of the phosphor powder are disposed in a single area of the light emitting region.

44. The LED lighting module of claim 43, wherein the transparent substrate is made of a material selected from the group consisting of PET, PMMA, PC and glass.

45. The LED lighting module according to claim 32, wherein the phosphor powder is formed onto the plurality of light emitting regions of the transparent substrate by a spraying, printing, evaporation, or sputtering method.

46. The LED lighting module of claim 45, wherein when each of the plurality of micro LED arrays is formed by two or more micro LEDs, the micro LEDs have a plurality of light emitting elements with an electrical connection relation and disposed on a same substrate.

47. The LED lighting module of claim 46, wherein the phosphor powder is a quantum dot, or at least 20 particles of the phosphor powder are disposed in a single area of the light emitting region.

48. The LED lighting module of claim 47, wherein the transparent substrate is made of a material selected from the group consisting of PET, PMMA, PC and glass.

49. The LED lighting module of claim 1, wherein the phosphor film has a plurality of barriers disposed on a lower surface of the phosphor film and configured to be opposite to the plurality of micro LED arrays and situated between the plurality of light emitting regions for preventing the light emitted from the plurality of micro LED arrays from spilling to a non-collimated position of the light emitting region.

50. The LED lighting module of claim 1, wherein the phosphor film has a plurality of barriers disposed on an upper surface of the phosphor film and configured to be opposite to the plurality of micro LED arrays and situated between the plurality of light emitting regions for preventing the light emitted from the plurality of micro LED arrays from spilling to a non-collimated position of the light emitting region.

51. The LED lighting module of claim 1, wherein the phosphor film has a plurality of barriers disposed on an upper surface and a lower surface of the phosphor film and configured to be opposite to the plurality of micro LED arrays respectively, and situated between the plurality of light emitting regions for preventing the light emitted from the plurality of micro LED arrays from spilling to a non-collimated position of the light emitting region.

52. The LED lighting module according to claim 49, wherein the barriers are formed onto the phosphor film by a spraying, printing, evaporation, or sputtering method.

53. The LED lighting module of claim 52, wherein the phosphor film has a plurality of grooves, and a photoresist material is filled into the grooves to form the barriers.

54. The LED lighting module according to claim 50, wherein the barriers are formed onto the phosphor film by a spraying, printing, evaporation, or sputtering method.

55. The LED lighting module of claim 54, wherein the phosphor film has a plurality of grooves, and a photoresist material is filled into the grooves to form the barriers.

56. The LED lighting module according to claim 51, wherein the barriers are formed onto the phosphor film by a spraying, printing, evaporation, or sputtering method.

57. The LED lighting module of claim 56, wherein the phosphor film has a plurality of grooves, and a photoresist material is filled into the grooves to form the barriers.

* * * * *